US010712855B2

(12) United States Patent
Ma et al.

(10) Patent No.: US 10,712,855 B2
(45) Date of Patent: Jul. 14, 2020

(54) ARRAY SUBSTRATE, DISPLAY PANEL AND DISPLAY DEVICE

(71) Applicant: SHANGHAI AVIC OPTO ELECTRONICS CO., LTD., Shanghai (CN)

(72) Inventors: Yufang Ma, Shanghai (CN); Huijun Jin, Shanghai (CN); Shoufu Jian, Shanghai (CN); Zhiqiang Xia, Shanghai (CN)

(73) Assignee: SHANGHAI AVIC OPTO ELECTRONICS CO., LTD., Shanghai (CN)

( * ) Notice: Subject to any disclaimer, the term of this patent is extended or adjusted under 35 U.S.C. 154(b) by 39 days.

(21) Appl. No.: 16/164,801

(22) Filed: Oct. 19, 2018

(65) Prior Publication Data
US 2019/0050100 A1  Feb. 14, 2019

(30) Foreign Application Priority Data
Apr. 2, 2018  (CN) .......................... 2018 1 0281268

(51) Int. Cl.
*G06F 3/041* (2006.01)
*H01L 27/12* (2006.01)
(Continued)

(52) U.S. Cl.
CPC ........ *G06F 3/0412* (2013.01); *G02F 1/13338* (2013.01); *G02F 1/136286* (2013.01);
(Continued)

(58) Field of Classification Search
None
See application file for complete search history.

(56) References Cited

U.S. PATENT DOCUMENTS

2014/0168109 A1* 6/2014 Kang ...................... G06F 3/044
345/173
2016/0378233 A1* 12/2016 Huo .................... H01L 27/3276
345/174

(Continued)

FOREIGN PATENT DOCUMENTS

CN         102937852 A      2/2013

*Primary Examiner* — Nitin Patel
(74) *Attorney, Agent, or Firm* — Kilpatrick Townsend & Stockton, LLP

(57) ABSTRACT

Provided are an array substrate, a display panel, and a display device. The array substrate includes a base substrate, scanning lines extending along first direction and data lines extending along second direction disposed on base substrate, pixel units arranged in an array along first direction and second direction; touch electrodes and touch traces disposed on base substrate, and a first insulating layer disposed between the touch traces and the touch electrodes in a direction perpendicular to base substrate. Each touch trace is connected to the touch electrodes via a first through hole in the first insulating layer. Two scanning lines are disposed between two adjacent pixel units in the second direction, and each scanning line controls its adjacent pixel unit. An orthographic projection of the first through hole on the base substrate is located between the two scanning lines and does not overlap with them.

20 Claims, 18 Drawing Sheets

(51) Int. Cl.
  *G02F 1/1333* (2006.01)
  *G06F 3/044* (2006.01)
  *G02F 1/1362* (2006.01)
  *G09G 3/36* (2006.01)
  *G02F 1/1337* (2006.01)

(52) U.S. Cl.
  CPC ............ *G06F 3/044* (2013.01); *H01L 27/124* (2013.01); *G02F 1/133707* (2013.01); *G02F 2201/40* (2013.01); *G09G 3/3648* (2013.01)

(56) References Cited

U.S. PATENT DOCUMENTS

| | | | |
|---|---|---|---|
| 2017/0185196 A1* | 6/2017 | Kim | G06F 3/0412 |
| 2017/0192571 A1* | 7/2017 | Kim | G06F 3/0412 |
| 2018/0188584 A1* | 7/2018 | Yeh | G02F 1/1339 |

* cited by examiner

ARRAY SUBSTRATE, DISPLAY PANEL AND DISPLAY DEVICE

CROSS-REFERENCE TO RELATED APPLICATIONS

The present application claims priority to Chinese Patent Application No. 201810281268.5, filed on Apr. 2, 2018, the content of which is incorporated herein by reference in its entirety.

FIELD

The present disclosure relates to the field of display technologies, and in particular, to an array substrate, a display panel, and a display device.

BACKGROUND

With increasing applications of multimedia devices, there is increasing talk of a touch screen. As a new type of input device, the touch screen has multiple advantages, such as ruggedness, fast response, space saving, and easy communication. At present, according to the constitution and structure, touch screens can be divided into an Add on Mode Touch Panel, an On Cell Touch Panel, and an In Cell Touch Panel. The Add on Mode Touch Panel is manufactured by separately producing the touch screen and a liquid crystal display (LCD), and then bonding them together to form a liquid crystal display screen with the touch function. The Add on Mode Touch Panel has shortcomings, such as high manufacturing cost, low light transmittance, and thick module. The In Cell Touch Panel embeds the touch electrode of the touch screen in the interior of the liquid crystal display, which can reduce the overall thickness of the module and greatly reduce the manufacturing cost of the touch screen, and thus is favored by most panel manufacturers.

For the layout of an array substrate of an In Cell Touch Panel in the related art, the array panel is provided thereon with a substrate, and the substrate is provided thereon with scanning lines, data lines, and pixel electrodes. The scanning line for transmitting the driving signal and the data line for transmitting the input signal define pixel areas on the substrate, and the pixel electrodes are disposed in the pixel areas. Each pixel electrode corresponds to a thin film transistor in its corresponding pixel area. During the display process, the scanning lines and data lines perform driving and data inputting.

However, in addition to the structure of the complex driving display, the array substrate also needs to integrate the related structure with the touch function. For example, it is necessary to leave a certain space for the touch trace, which requires sacrificing the aperture ratio of a part of the pixels, and as a result, the overall aperture ratio of the pixels may decrease.

SUMMARY

The present disclosure provides an array substrate, a display panel, and a display device.

The present disclosure provides an array substrate, including a base substrate; scanning lines disposed on the base substrate and extending along a first direction; data lines disposed on the base substrate and extending along a second direction, and the plurality of scanning lines intersects with and is insulated from the plurality of data lines; pixel units arranged in an array along the first direction and the second direction; touch electrodes and touch traces, both of which are disposed on the base substrate; and a first insulating layer disposed between the plurality of touch traces and the plurality of touch electrodes in a direction perpendicular to the base substrate, and each of the plurality of touch traces is connected to a corresponding one of the plurality of touch electrodes via a first through hole in the first insulating layer. Two scanning lines of the plurality of scanning lines are disposed between two adjacent pixel units of at least some of the plurality of pixel units in the second direction, and each of the two scanning lines controls its adjacent pixel unit of the two adjacent pixel units; and an orthographic projection of the first through hole on the base substrate is located between the two scanning lines and does not overlap with the two scanning lines.

The present disclosure further provides a display panel, including the abovementioned array substrate, a color film substrate disposed opposite to the array substrate, and a liquid crystal layer sealed between the array substrate and the color film substrate.

The present disclosure further provides a display device, including the abovementioned display panel.

BRIEF DESCRIPTION OF DRAWINGS

The accompanying drawings described herein are provided for further illustrating the present disclosure and constitute a part of the present disclosure, and are intended to be a part of this disclosure. The embodiments of the present disclosure and the description thereof are for illustrating the present disclosure and are not intended to limit the present disclosure.

REFERENCE SIGNS

Figure 1:
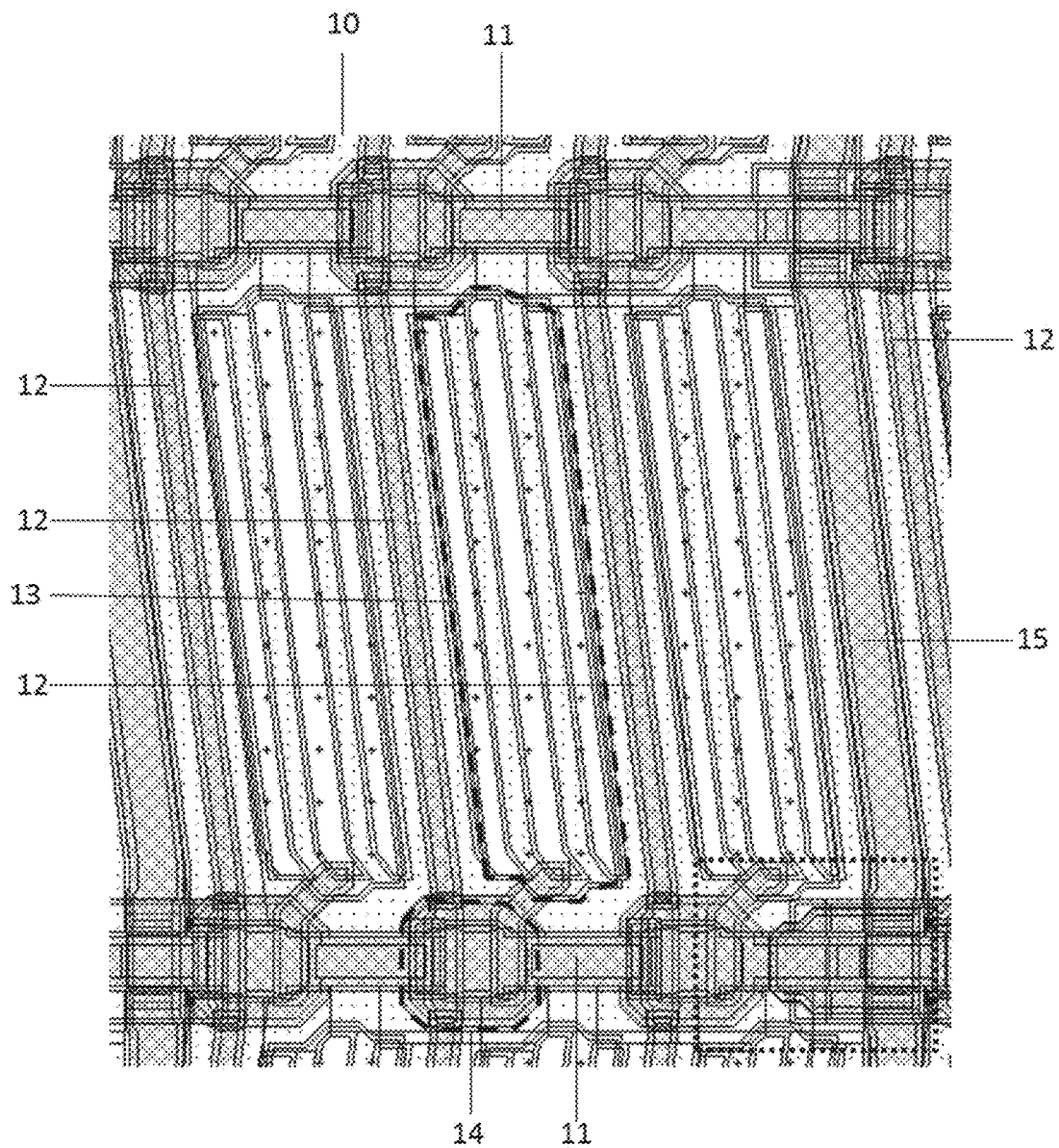
FIG. 1 is a layout diagram of an array substrate of an In Cell Touch Panel in the related art.

X—first direction;
Y—second direction;
110—base substrate;
120—scanning line;
130—data line;
140—touch electrode;
150—touch trace;
151—pad;
160—first insulating layer;
170—first through hole;
180—thin film transistor;
190—pixel electrode;
200—common electrode;
210—first spacing;
220—second spacing;
230—third spacing;
300—connecting portion;
310—first connecting portion;
311—first branch;
320—second connecting portion;
330—auxiliary portion;
340—dummy connecting portion;
341—first dummy section;
342—second dummy section;
343—break;
01—array substrate;
02—color film substrate;
03—liquid crystal layer.

DESCRIPTION OF EMBODIMENTS

The present disclosure will be further described with reference to the accompanying drawings and embodiments.

It should be noted that details are set forth in the following description in order to better illustrate the present disclosure. However, the present disclosure can be implemented in various other ways than those described herein. The present disclosure is therefore not limited by the embodiments disclosed as follows.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be noted that, the expressions such as "upper", "lower", "left", "right" and the like mentioned in embodiments of the present disclosure are described with reference to the placement status in the accompanying drawings, and should not be construed as limiting embodiments of the present disclosure. In addition, it should also be understood that, in the context, while referring to an element being formed "above" or "below" another element, it is possible that the element is directly formed "above" or "below" the other element, it is also possible that the element is formed "above" or "below" the other element via an intermediate element.

The present disclosure will be further described with reference to the accompanying drawings and embodiments. However, the embodiments may be implemented in many manners and should not be construed as being limited to the embodiments provided herein. A same reference sign in the drawings represents a same or similar structure, and thus a repetitive description thereof will be omitted. The expressions about the positions and directions in the present disclosure are all described by taking the drawings as examples, however, changes may be made if necessary, and all these changes should be included in the protection scope of the present disclosure. The drawings of the present disclosure are merely for illustrating a relative position relationship, and the layer thicknesses of some portions are exaggerated for the sake of comprehension, and the layer thicknesses in the drawings do not represent the proportional relationship of the actual layer thicknesses. The embodiments in the present disclosure and the features in the embodiments may be combined with each other.

In the following embodiments, the drawings are drawn and illustrated by taking a flexible display panel having a rectangular shape as an example. However, in practical applications, the flexible display panel can also have a regular or irregular shape such as a circular or a polygonal shape, which will not be limited herein by embodiments of the present disclosure. Meanwhile, in order to more clearly describe partial structures in the flexible display panel, a size of each structure is correspondingly adjusted in the following drawings of the embodiments of the present disclosure.

It should be noted that the ellipses " . . . " included in the following drawings of the embodiments of the present disclosure mean that the flexible display panel extends in a left/right direction or an upward/downward direction, and the omitted parts may include other structures, which will not be limited herein by the embodiment of the present disclosure. The drawings of the embodiments of the present disclosure are labeled with same reference signs, Moreover, similarities in different embodiments will not be described repeatedly.

As shown FIG. 1, which is a layout diagram of an array substrate of an In Cell Touch Panel in the related art, the array substrate is provided thereon with a substrate 10, and the substrate 10 is provided thereon with scanning lines 11, data lines 12, and pixel electrodes 13. The scanning line 11 for transmitting the driving signal and the data line 12 for transmitting the input signal define pixel areas on the substrate 10, and the pixel electrodes 13 are disposed in the pixel areas. Each pixel electrode 13 corresponds to a thin film transistor 14 in its corresponding pixel area. During the display process, the scanning lines 11 and data lines 12 perform the actions of driving and data inputting.

Figure 2:
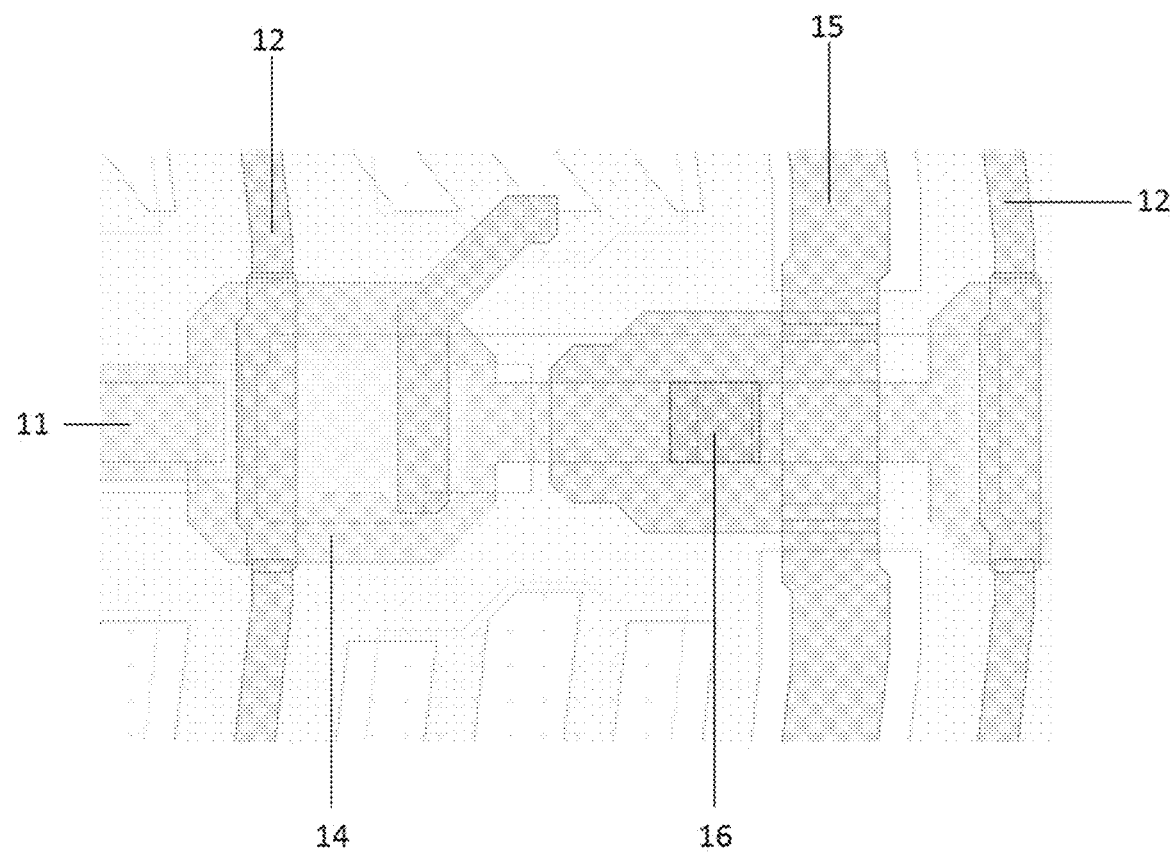
FIG. 2 is an enlarged schematic view of a dotted box of FIG. 1.

As shown in FIG. 1 and FIG. 2, FIG. 2 is an enlarged schematic view of a dotted box of FIG. 1.

In the related art, at least one data line 12 requires a certain space adjacent thereto for arranging the touch trace 15. This has to sacrifice the aperture ratio of some pixels. The touch trace 15 needs to be connected to the touch electrode via the trace through hole 16, and the trace through hole 16 also requires a certain space. Generally, the trace through hole 16 for the touch trace 15 is disposed in a spacing between pixels where the corresponding scanning line 11 is located. However, the spacing between the pixels has a limited space, so that the trace through hole 16 for the touch trace 15 may overlie the scanning line 11, which would cause the coupling capacitance on the scanning line 11 to increase, thereby increasing the load of the scanning line 11.

Figure 3:
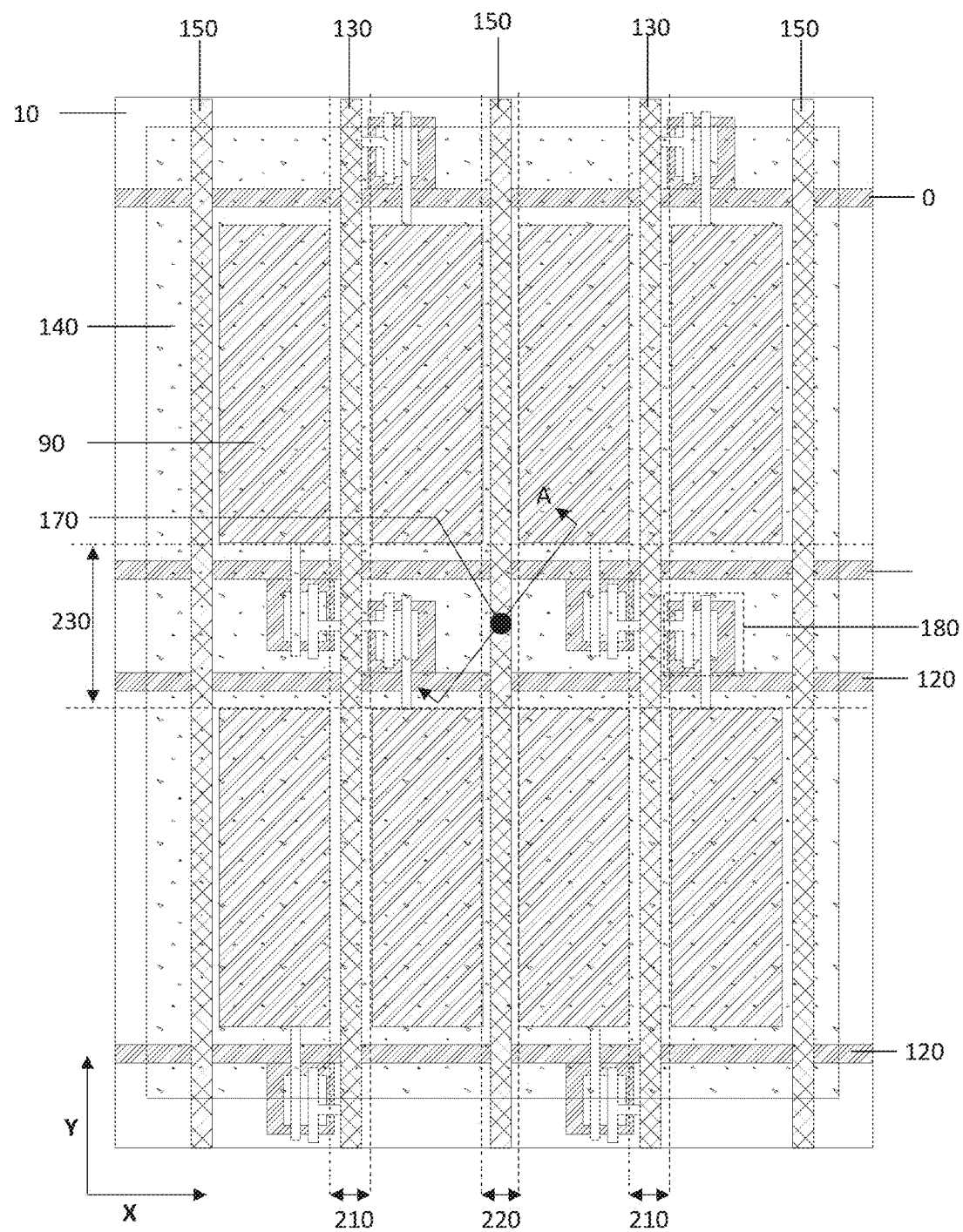
FIG. 3 is a layout diagram of an array substrate according to an embodiment of the present disclosure.
Figure 4:
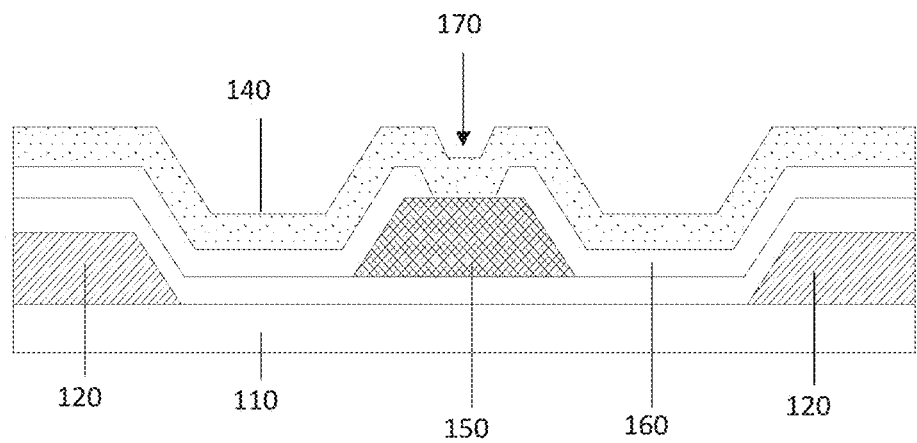
FIG. 4 is a cross-sectional view taken along line A-A of FIG. 3.

In view of this, the present disclosure provides an array substrate. As shown in FIG. 3 and FIG. 4, FIG. 3 is a layout diagram of an array substrate according to an embodiment of the present disclosure, and FIG. 4 is a cross-sectional view taken along line A-A of FIG. 3.

The array substrate includes: a base substrate 110; scanning lines 120 disposed on the base substrate and extending along a first direction X; and data lines 130 disposed on the base substrate and extending along a second direction Y. The scanning lines 120 intersect with and are insulated from the data lines 110. The array substrate further includes pixel units arranged in an array along the first direction X and the second direction Y.

In an embodiment, a first spacing 210 or a second spacing 220 extending along the second direction Y can be formed between at least sonic of the pixel units, and a third spacing 230 extending along the first direction X is formed between at least sonic of the pixel units. Along the first direction X, the first spacing 210 and the second spacing 220 are alternately arranged.

In this embodiment, the pixel units are arranged in rows and columns, that is, the first direction X is parallel to the row direction of the pixel units, and the second direction Y is parallel to the column direction of the pixel units. The third spacing 230 extending along the first direction X is formed between two adjacent pixel rows, and the first spacing 210 and the second spacing 220 extending along the second direction Y are formed between two adjacent pixel columns. Here, along the first direction X, the first spacing 210 and the second spacing 220 are alternately arranged.

In an embodiment, one data line 130 can be provided in the first spacing 210, and the second spacing 220 can be provided with no data line. Two scanning lines 120 can be provided in the third spacing 230. For example, the array substrate can further include a thin film transistor (TFT) 180 disposed on the base substrate 110. The thin film transistor 180 is located in the third spacing 230. In the second direction Y, two scanning lines 120 are disposed between at least sonic of adjacent pixel units, and the two scanning lines 120 respectively control the pixel units adjacent thereto.

In this embodiment, the thin film transistor 180 includes: a gate electrode disposed on the base substrate; a gate insulating layer disposed on a side of the gate electrode away from the base substrate; an active layer disposed on a side of the gate insulating layer away from the base substrate a source electrode and a drain electrode disposed on a side of the active layer away from the base substrate, the source electrode and the drain electrode being spaced apart from each other and both being in contact with the active layer; and a second insulating layer disposed on a side of the source and drain electrodes away from the base substrate. It should be noted that this embodiment takes a bottom gate type thin film transistor as the thin film transistor by way of an example, but in other embodiments of the present disclosure, the thin film transistor can also be a top gate type thin film transistor.

In the third spacing 230, one data line 130 is connected to source electrodes or drain electrodes of two thin film transistors 180 adjacent to the data line 130. Gate electrodes of the two thin film transistors 180 connected to a same data line 130 are respectively connected to different scanning lines 120. That is, in the second direction Y, each pixel row is adjacent to one scanning line 120 on each side, and the thin film transistors 180 corresponding to two adjacent pixel units in each pixel row are connected to different scanning lines 120.

In an embodiment, in a same third spacing 230, the thin film transistor 180 is disposed between two scanning lines 120.

The array substrate further includes touch electrodes 140 and touch traces 150 disposed on the base substrate 110; and a first insulating layer 160 disposed between the touch traces 150 and the touch electrodes 140 in a direction perpendicular to the base substrate 110. The touch trace 150 is connected to the touch electrode 140 via the first through hole 170 in the first insulating layer 160.

It should be understood that the touch electrodes provided by the present disclosure can be used for a mutual-capacitive touch structure, or a self-capacitive touch structure.

This embodiment takes the self-capacitive touch structure as an example. The touch electrodes 140 and the pixel electrodes 190 are disposed in different layers. The touch electrodes 140 are spaced apart from each other, and each touch electrode 140 corresponds to at least one touch trace 150. In a self-capacitive touch mode, the position coordinate of the touch point is determined by the capacitance of the touch electrode 140 with respect to the ground. During the touch scanning, the touch driving circuit supplies a touch sensing signal to the corresponding touch electrode 140 by the touch trace 150, and then the signal of the transparent touch sensing electrode is fed back to the touch driving circuit by the touch trace 150. During this period, when a conductor (for example, a finger) gets near the top of the touch electrode 140, the capacitance of the touch electrode 140 with respect to the ground will change, that is, a small current flows through the conductor. The signal fed back to the touch driving circuit by the touch electrode 140 changes, and then the touch driving circuit can determine the touch behavior by detecting the changed signal.

In an embodiment, the touch trace 150 extends along the second direction Y and is located in the second spacing 220. That is, the data line 130 is arranged to be parallel to the touch trace 150, and the touch trace 150 and the data line 130 are alternately arranged along the first direction X.

In an embodiment, an orthographic projection of the first through hole 170 on the base substrate 110 is located between two scanning lines 120 and does not overlap with the two scanning lines 120. Since the touch trace 150 extends in the second direction Y and is located in the second spacing 220, the first through hole 170 is located in an area where the second spacing 220 overlaps with the third spacing 230.

In other embodiments of the present disclosure, each touch electrode may correspond to parallel touch traces. In this way, it can reduce the voltage drop generated on the touch trace when transmitting a signal to a same touch electrode.

In an embodiment, the touch electrode 140 can be a transparent conductive material, such as transparent ITO.

In an embodiment, the first insulating layer 160 can include a SiN material.

In an embodiment, the scanning line 120 and the data line 130 are disposed in different layers. In this embodiment, the scanning line 120 and the gate electrode of the thin film transistor 180 are disposed in a same layer, and the data line 130 and the touch trace 150 are disposed in a same layer and made of a same material. In an example, the data line 130 and the source and drain electrodes of the thin film transistor 180 are disposed in a same layer and made of a same material. The touch electrode 140 is disposed on a side of the scanning line 120 and the data line 130 away from the base substrate 110.

It can be understood that in this embodiment, the plurality of scanning lines 120, the plurality of data lines 130 and the plurality of touch traces 150 that intersect with each other in an insulation manner together form a grid-like orthographic projection on the base substrate 110. In an embodiment, a mesh area of the grids defined by the plurality of scanning lines 120, the plurality of data lines 130 and the plurality of touch traces 150 is an area where one pixel unit is located.

In an embodiment, the array substrate further includes pixel electrodes 190 disposed on the base substrate 110. The pixel electrodes 190 correspond to the pixel units in one-to-one correspondence. An orthographic projection of a pixel electrode 190 on the base substrate 110 is located within a respective one pixel unit.

In an embodiment, the pixel electrode is located on a side of the touch electrode close to the pad. The pixel electrode is located between the first insulating layer and the second insulating layer. That is, the second insulating layer of the thin film transistor, the pixel electrode, the first insulating layer, and the touch electrode are sequentially stacked in a direction perpendicular to the base substrate. Since each pixel electrode is located in a respective one pixel unit, there is a gap between adjacent pixel electrodes, and the first through hole may be located at the gap between adjacent pixel electrodes. When the pixel electrode is disposed on the touch electrode, it is needed to additionally provide an aperture on the touch electrode, and a space can be provided for the connection between the pixel electrode and the source and drain electrodes by the aperture.

With the array substrate provided in this embodiment, the first through hole is connected to the touch electrode and the touch signal line, so that a strong electric field exists in the area where the first through hole is located. The first through hole is located between two adjacent scanning lines and does not overlap with the two scanning lines, so that a parasitic capacitance can be avoided between the first through hole and the scanning line. Moreover, as scanning lines are provided on both sides of the first through hole, even if a strong electric field exists in the area of the first through hole and a lateral capacitance is generated between the first through hole and the scanning line, the both sides of the first through hole can be consistently affected by the electric field, which can reduce the capacitance difference between the two sides, thereby weakening the signal difference in different regions on the touch electrode caused by the interference or the parasitic capacitance and thus improving the touch precision. Meanwhile, since the first through hole is located between two scanning lines in the third spacing, no additional space is required for accommodating the first through hole, which can facilitate increasing the aperture ratio of the display panel. Besides, in a same third spacing, the thin film transistor is also located between two scanning lines. Therefore, the first through hole and the thin film transistor can share the space between two scanning lines, without additionally designing a curved structure for the scanning line to avoid the first through hole and the thin film transistor. This can prevent the curved structure from additionally occupying space in the display panel, and avoid an influence difference by the signal of the scanning line with respect to signals of other electrodes or trace structures in the pixel electrode due to the distance change between the scanning line and the pixel area. In addition, by arranging the first through hole in a space between two adjacent scanning lines, the first through hole and the thin film transistor can share the space between two adjacent scanning lines. There is a sufficient space for correspondingly enlarging the aperture of the first through hole. The contact area between a first connecting portion and the touch signal at the first through hole can be increased, the contact performance between the first connecting portion and the touch signal at the first through hole can be improved, and the binding capability between the first connecting portion and the touch signal at the first through hole can be improved, so as to avoid signal disconnection due to separation of film layers.

Figure 5:
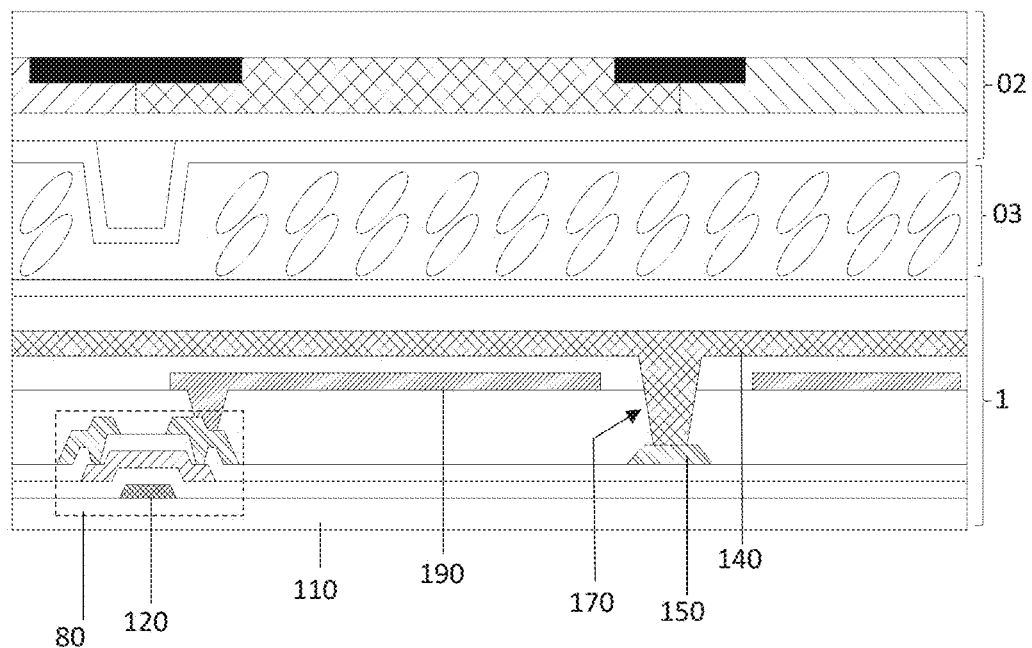
FIG. 5 is a schematic diagram of a display panel according to an embodiment of the present disclosure.

As shown in FIG. 5, FIG. 5 is a schematic diagram of a display panel according to an embodiment of the present disclosure.

The present disclosure further provides a display panel including any array substrates 01 described in the present disclosure.

The display panel further includes a color film substrate 02 disposed opposite to the array substrate 01, and a liquid crystal layer 03 sealed between the array substrate 01 and the color film substrate 02. In an embodiment, on the side facing the liquid crystal layer 03, an array alignment film is disposed on an inner side of the array substrate 01, and a color film alignment film is disposed on an inner side of the color film substrate 02. On the side facing away from the liquid crystal layer 03, an array polaroid and a light-reflecting film are sequentially disposed on an outer side of the array substrate 01, and a color film polaroid is disposed on an outer side of the color film substrate 02. The color film substrate 02 may further include a color film base substrate and a black matrix, a color resin and a planarization layer which are sequentially disposed on the color film base substrate.

The display panel provided by the present disclosure can decrease the load of the display panel while increasing the aperture ratio of the display panel.

Figure 6:
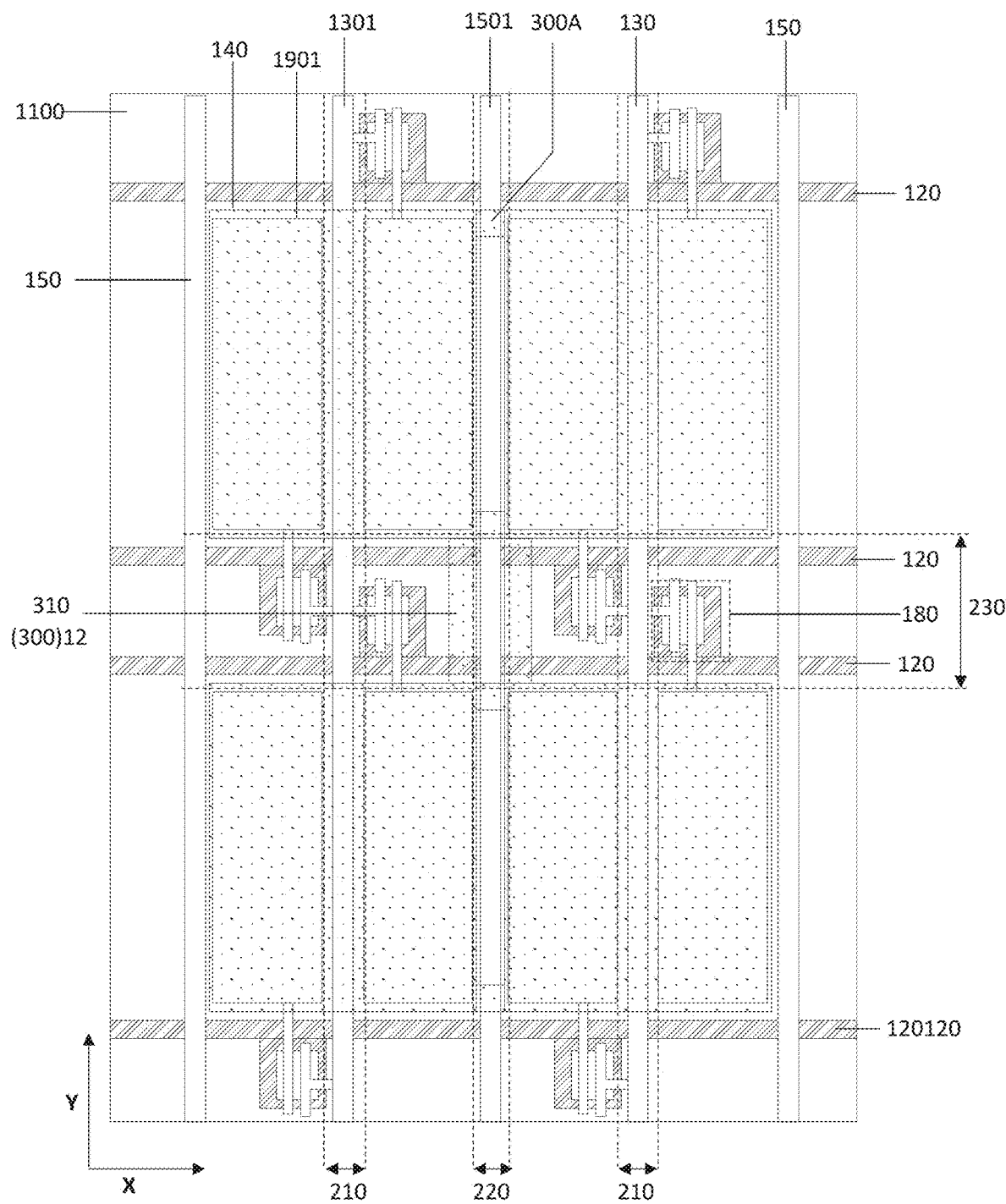
FIG. 6 is a layout diagram of another array substrate according to an embodiment of the present disclosure.
Figure 7:
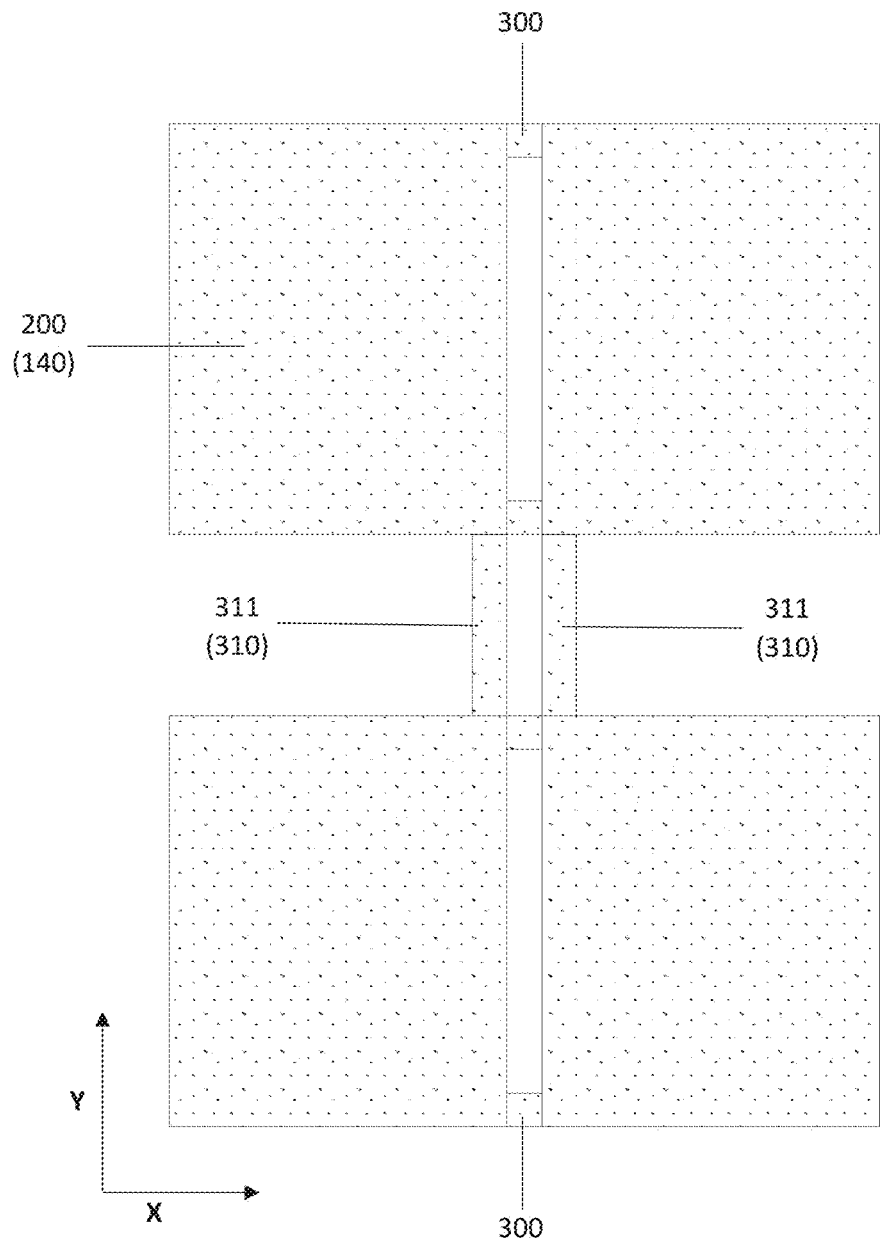
FIG. 7 is a partial schematic view of common electrodes in FIG. 6.

As shown in FIG. 6 and FIG. 7, FIG. 6 is a layout diagram of another array substrate according to an embodiment of the present disclosure, and FIG. 7 is a partial schematic view of common electrodes in FIG. 6.

In an embodiment, the array substrate further includes common electrodes 200 disposed on the base substrate 110. An orthographic projection of the common electrode 200 on the base substrate 110 covers the pixel unit. The common electrode 200 is insulated from and overlaps with the pixel electrode 190. The liquid crystal molecules are controlled to rotate under the electric field generated between the common electrode 200 and the pixel electrode 190, thereby controlling the light emitting of the liquid crystal display panel.

In the embodiment, the common electrode 200 is reused as the touch electrode 140.

That is, during the touch period, the touch trace 150 transmits a touch voltage to the common electrode 200 (i.e., the touch electrode 140); and during the display period, the touch trace 150 transmits a common voltage to the common electrode 200.

In an embodiment, common electrodes 200 are connected by connecting portions 300 to form a common electrode set, and one common electrode set is reused as one touch electrode 140.

In this embodiment, the scanning lines 120 and the touch traces 150 that intersect with each other in an insulation manner together form a grid-like orthographic projection on the base substrate 110. The common electrode 200 is located in a mesh area of the grids defined by the scanning lines 120 and the touch traces 150. Therefore, a gap is formed between adjacent common electrodes 200. In an embodiment, the gap between adjacent common electrodes 200 is located in the second spacing 220 and the third spacing 230. That is, on the one hand, the common electrodes 200 expose the touch trace 150 and the scanning line 120 in the second spacing 220 and the third spacing 230; and on the other hand, one common electrode 200 covers two pixel electrodes 190 and one data line 130 between the two pixel electrodes 190.

In this way, with the touch electrode reused by the common electrode, a parasitic capacitance generated between the touch electrode and the touch trace and the thin film transistor connected to another touch electrode can be avoided by using the gap between the common electrodes. This can avoid a coupling capacitance generated between the electrode structure and the circuit structure, a signal interference and affecting the display while allowing the film layer to be reused. Meanwhile, with the touch electrode reused by the common electrode, the data line is covered by the touch electrode, thereby shielding the signal generated by the data line and thus preventing the electric field generated by the data line and the pixel electrode from affecting the rotation of the liquid crystals, which would otherwise result in poor display. It should be understood that the touch trace passing through the touch electrode (i.e., the touch trace avoided by the common electrode of the touch electrode) can be other touch trace for transmitting a signal to other common electrode, instead of the touch trace being electrically connected to the touch electrode.

In other embodiments of the present disclosure, the common electrodes can also be in one-to-one correspondence with the pixel units, that is, each common electrode is located in a respective one pixel unit, and details thereof will not be further described herein.

In an embodiment, the connecting portions 300 are located in the second spacing 220 and the third spacing 230. The connecting portion 300 is located in the gap of the common electrodes 200 in a same common electrode set and is used for electrically connecting the respective common electrodes 200, such that the common electrodes 200 can have a same potential to form one touch electrode 140.

It should be understood that for convenience of description, this embodiment is exemplified by four common electrodes constituting one touch electrode, but the present disclosure is not limited thereto. In other embodiments of the present disclosure, the number of common electrodes in one common electrode set can be 8, 10, 50, or any number.

In an embodiment, the connecting portions 300 include first connecting portions 310. The first connecting portion 310 extends in the second direction Y and is used for connecting two adjacent common electrodes 200 in the second direction Y. The first connecting portion 310 is located at an overlapping area between the second spacing 220 and the third spacing 230. That is, in the first direction X, there is a respective one thin film transistor 180 on each of both sides of the touch trace 150 disposed in the overlapping area between the second spacing 220 and the third spacing 230, and the first connecting portion 310 is located between two thin film transistors 180.

In an embodiment, at least some of the first connecting portions 310 include at least two first branches 311 extending in the second direction Y. A first branch 311 is provided on each of both sides of the touch trace 150. At least some of the common electrodes 200 that are adjacent in the second direction Y are electrically connected by the first branches 311.

It should be noted that the overlapping area between the second spacing 220 and the third spacing 230 in this embodiment not only includes the area where the second spacing 220 and the third spacing 230 project and overlap on the substrate 110, and may also include the area in a part of the third spacing 230 in the periphery of the projecting and overlapping area. Here, the overlapping area between the second spacing 220 and the third spacing 230 is located between thin film transistors 180 on both sides of the second spacing 220, and does not overlap with the thin film transistors 180.

That is, in the first direction X, there is a respective one thin film transistor 180 on each of both sides of the touch trace 150 in the overlapping area between the second spacing 220 and the third spacing 230. Although the first connecting portions 310 are located on both sides of the touch trace 150, the first connecting portions 310 are still located between the two thin film transistors 180.

In an embodiment, in the first direction X, the touch trace 150 in the overlapping area between the second spacing 220 and the third spacing 230 has a same distance from the first branch portions 311 on both sides. The first branches 311 on both sides of the touch trace 150 have a same distance from the respective thin film transistors 180. In this way, even if the thin film transistors on both sides of the touch trace are affected by the connecting portion to generate parasitic capacitance or interference, the thin film transistors on both sides of the touch trace can be consistently affected, thereby reducing the parasitic capacitance difference generated by the thin film transistors on both sides and thus weakening the display difference generated by the pixels controlled by the thin film transistors caused by the interference or the parasitic capacitance.

It should be understood that, the common electrode does not overlap with the touch trace. Therefore, in a common electrode set, the common electrodes on both sides of the second spacing may also be connected by a third or fourth connecting portion extending along the first direction. The third or fourth connecting portion crosses the second spacing. The first branch 311 can be indirectly electrically connected to the common electrode through the third or fourth connecting portion.

With the array substrate provided in this embodiment, the load problem between the signal lines can be alleviated while the display effect is improved, and meanwhile, the touch sensitivity can be optimized. Since there is no common electrode in the second spacing, adjacent common electrodes in the first direction can only be connected through the connecting portion. The touch detection is to determine the touch electrode corresponding to the position of the touch operation by calculating and analyzing the change of the capacitance of the touch electrode, thereby sensing the position of the touch operation. The capacitance $C=\varepsilon S/d$ (where $\varepsilon$ is a dielectric constant of the dielectric between the electrode plates, S is the area of the electrode plate, and d is the distance between the electrode plates). The touch electrode and the touch object are equivalent to two electrode plates of a capacitor, and their overlapping area is equivalent to S, where S directly affects the magnitude of the electrical signal sensed by the touch electrode. Therefore, the second spacing position will have a reduced touch sensitivity due to the lack of the common electrode. With this embodiment, the first connecting portion is provided, and the first connecting portion is disposed in the overlapping area between the second spacing and the third spacing. In this way, the area of the spacing area is not increased, the aperture ratio of the display panel is not affected, and the touch trace is not overlapped, thereby avoiding a load for the touch trace. Meanwhile, the first connecting portion can be provided in the second spacing and the signal strength at the second spacing can be indirectly increased. Since the signal between each common electrode is transmitted through the connecting portion, the voltage drop occurs when the signal flows through the common electrode. With the first connecting portion being connected to the position of the common electrode close to the second spacing, the area of the common electrode close to the second spacing can receive the signal, and the degree of voltage drop can be minimized, thereby improving the touch sensitivity corresponding to the second spacing area, and thus making the overall touch precision of the display panel more uniform.

Figure 8:
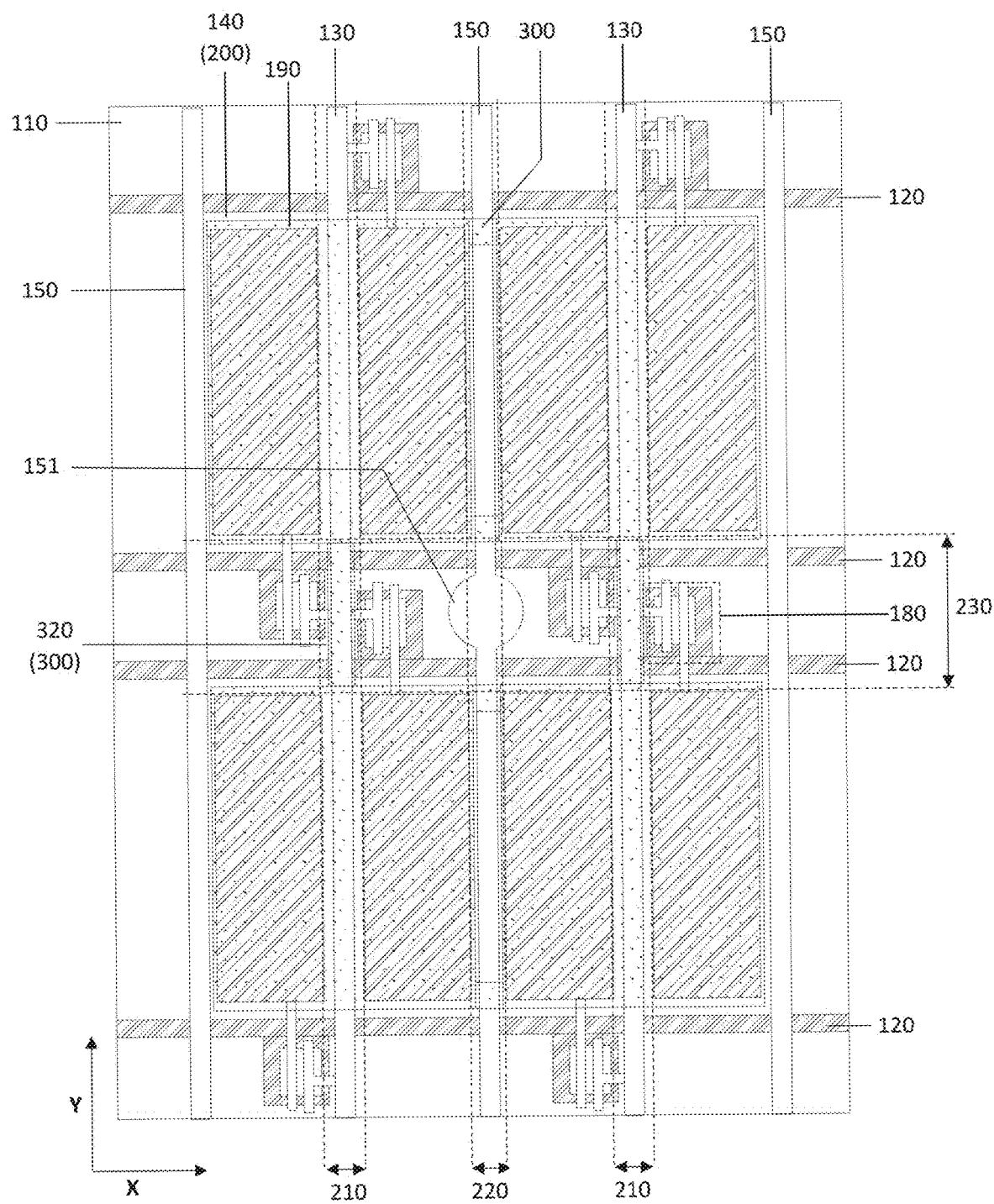
FIG. 8 is a layout diagram of still another array substrate according to an embodiment of the present disclosure.
Figure 9:
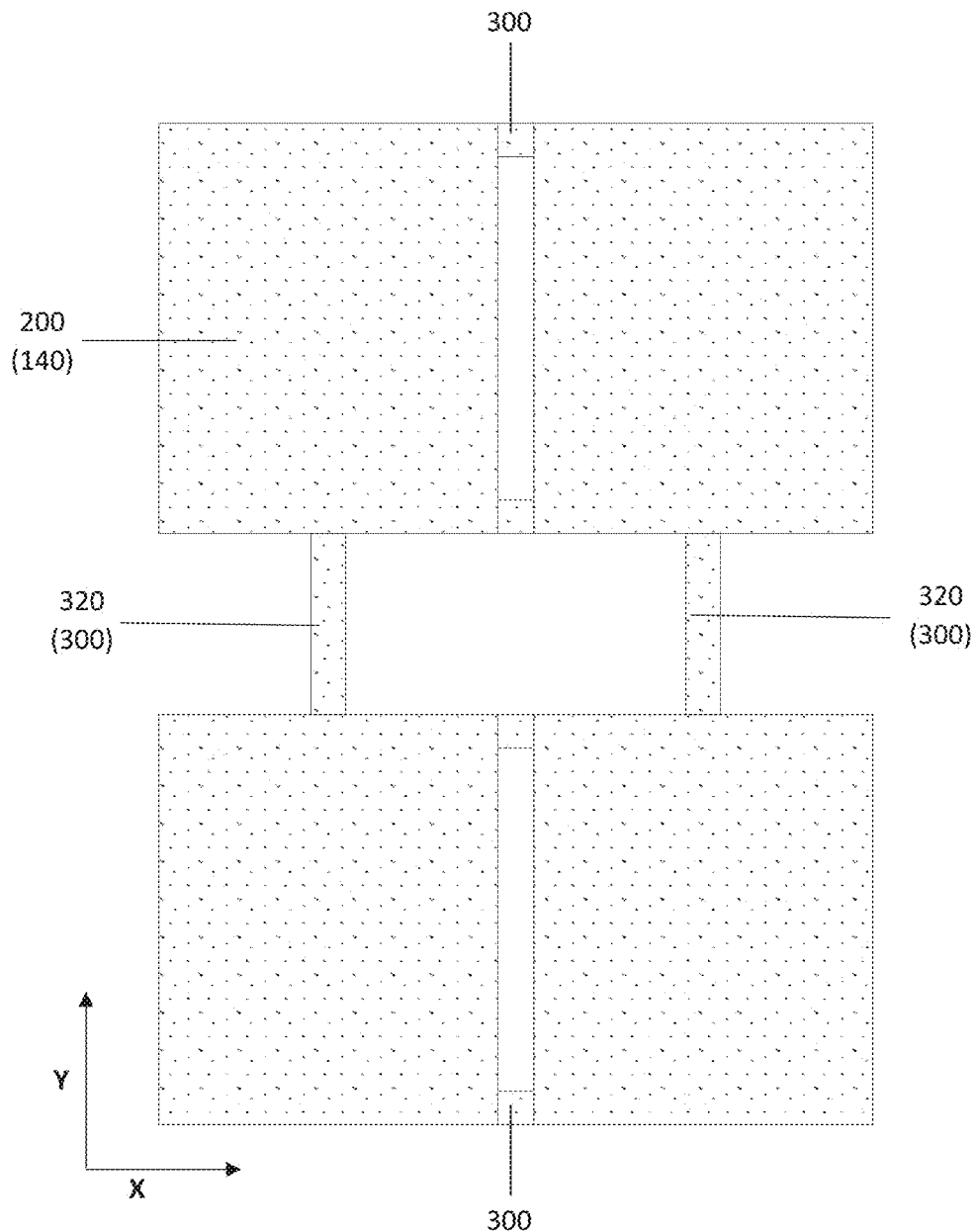
FIG. 9 is a partial schematic view of common electrodes in FIG. 8.

As shown FIG. 8 and FIG. 9, FIG. 8 is a layout diagram of still another array substrate according to an embodiment of the present disclosure; FIG. 9 is a partial schematic view of common electrodes in FIG. 8.

In an embodiment, the common electrodes 200 are connected by the connecting portion 300 to form a common electrode set, and one common electrode set is reused as one touch electrode 140.

In an embodiment, the connecting portions 300 include second connecting portions 320. The second connecting portion 320 extends in the second direction Y and is used for connecting two adjacent common electrodes 200 in the second direction Y. In an embodiment, the orthographic projection of the second connecting portion 320 on the base substrate 110 overlaps the data line 130.

The second connecting portion 320 is located in the overlapping area between the first spacing 210 and the third spacing 230, and at least some of adjacent common electrodes 200 in the second direction Y are electrically connected by the second connecting portion 320. That is, in the first direction X, the orthographic projection of the data line 130 in the overlapping area between the first spacing 210 and the third spacing 230 overlaps with the orthographic projection of the second connecting portion 320 on the base substrate 110.

In an embodiment, the width of the second connecting portion 320 is larger than the width of the data line 130. Here, the width direction is parallel to the first direction X.

In this way, by overlapping the data line with the second connecting portion, the connecting portion can be prevented from overlapping with the thin film transistor, which would otherwise result in signal interference, and thus space occupied by the connecting portion can be further decreased. This can facilitate increasing the aperture ratio of the display panel.

In an embodiment, in the overlapping area between the first spacing 210 and the third spacing 230, the second connecting portion 320 covers the data line 130, that is, in the overlapping area between the first spacing 210 and the third spacing 230, the data line 130 is located in the area covered by the projection of the second connecting portion 320 in the direction perpendicular to the base substrate 110. The space occupied by the connecting portion is further decreased, and meanwhile, the data line in the third spacing is completely covered by the connecting portion, which means that the data line is completely covered by the touch electrode when the data line passes through a touch electrode, so that the electric field generated by the data line can be more efficiently shielded, thereby preventing the electric field leakage from affecting the rotation of the liquid crystals during normal display. In an embodiment, the touch trace 150 includes a pad 151. The width of the touch trace 150 at the position of the pad 151 is larger than the width of the touch trace 150 at other positions. Here, the width direction is parallel to the first direction X.

In an embodiment, the pad 151 and the touch trace 150 are integrally formed.

In an embodiment, the orthographic projection of the pad 151 on the base substrate 110 is located between two scanning lines 120 in the third spacing 230 and does not overlap with the two scanning lines 120.

In an embodiment, in one third spacing 230, the thin film transistor 180 is located between two scanning lines 120. The orthographic projection of the pad 151 on the base substrate 110 does not overlap with the thin film transistor 180.

According to this embodiment of the present disclosure, the touch trace includes the pad, the width of the touch trace at the position of the pad is larger than the width of the touch trace 150 at other positions. In this way, the resistance of the touch trace can be decreased. Moreover, since the pad is located between two scanning lines in the third spacing, there is no need for an additional design space to accommodate the pad, which can facilitate increasing the aperture ratio of the display panel. Moreover, the thin film transistor is also located between two scanning lines, so that the pad and the thin film transistor can share the space between the two scanning lines, without additionally designing a curved structure for the scanning line to avoid the pad and the thin film transistor. This can prevent avoid an influence difference by the signal of the scanning line with respect to signals of other electrodes or trace structures in the pixel electrode due to the distance change between the scanning line and the pixel area. In addition, the array substrate can further include a support pillar PS located on a side of the pad away from the base substrate, and the orthographic projection of the support pillar on the base substrate is located in an area covered by the pad. In this way, the support pillar and the base substrate can share the area between the third spacing, and the PS can be used to shield the electric field generated by the base substrate, thereby preventing the electric field generated by the base substrate from affecting other circuit structures. Meanwhile, the pad can support the support pillar, thereby avoiding an excessive force on the support pillar, which would otherwise lead to over-pressure, collapsing or being penetrated for the film layer underneath the support pillar.

In an embodiment, the pad 151 has a same distance to the scanning lines 120 on both sides thereof.

In an embodiment, the pad 151 has a same distance to the thin film transistors 180 on both sides thereof.

In an embodiment, the pad 151 has a center symmetrical shape. The geometric center of the pad 151 is located on a line where the data line 130 is located.

In this way, even if the touch trace is expanded to form a pad, the thin film transistors on both sides of the touch trace may get closer to the touch trace and then the parasitic capacitance or interference may be generated due to the pad. However, the influences on the thin film transistors on both sides of the touch trace by the pad can be the same, and thus the difference in parasitic capacitances generated by the thin film transistors on both sides can be decreased, thereby weakening the display difference generated by the pixels under control of the thin film transistors due to the interference or the parasitic capacitance.

With the array substrate provided in this embodiment, the data line overlaps with the second connecting portion. In this way, the connecting portion can be prevented from overlapping with the touch trace of other touch electrode, the connecting portion can be prevented from overlapping with the thin film transistor, signal interference or parasitic capacitance can be avoided, and the space occupied by the connecting portion can be decreased, thereby facilitating increasing the aperture ratio of the display panel. Moreover, the connecting portion completely covers the data line in the third spacing, that is, the data line is completely covered by the touch electrode when the data line passes through a touch electrode, so that the electric field generated by the data line can be more efficiently shielded, thereby preventing the electric field leakage from affecting the rotation of the liquid crystals during normal display. In addition, since the second connecting portion overlaps with the data line, it can provide a space for the pad.

Figure 10:
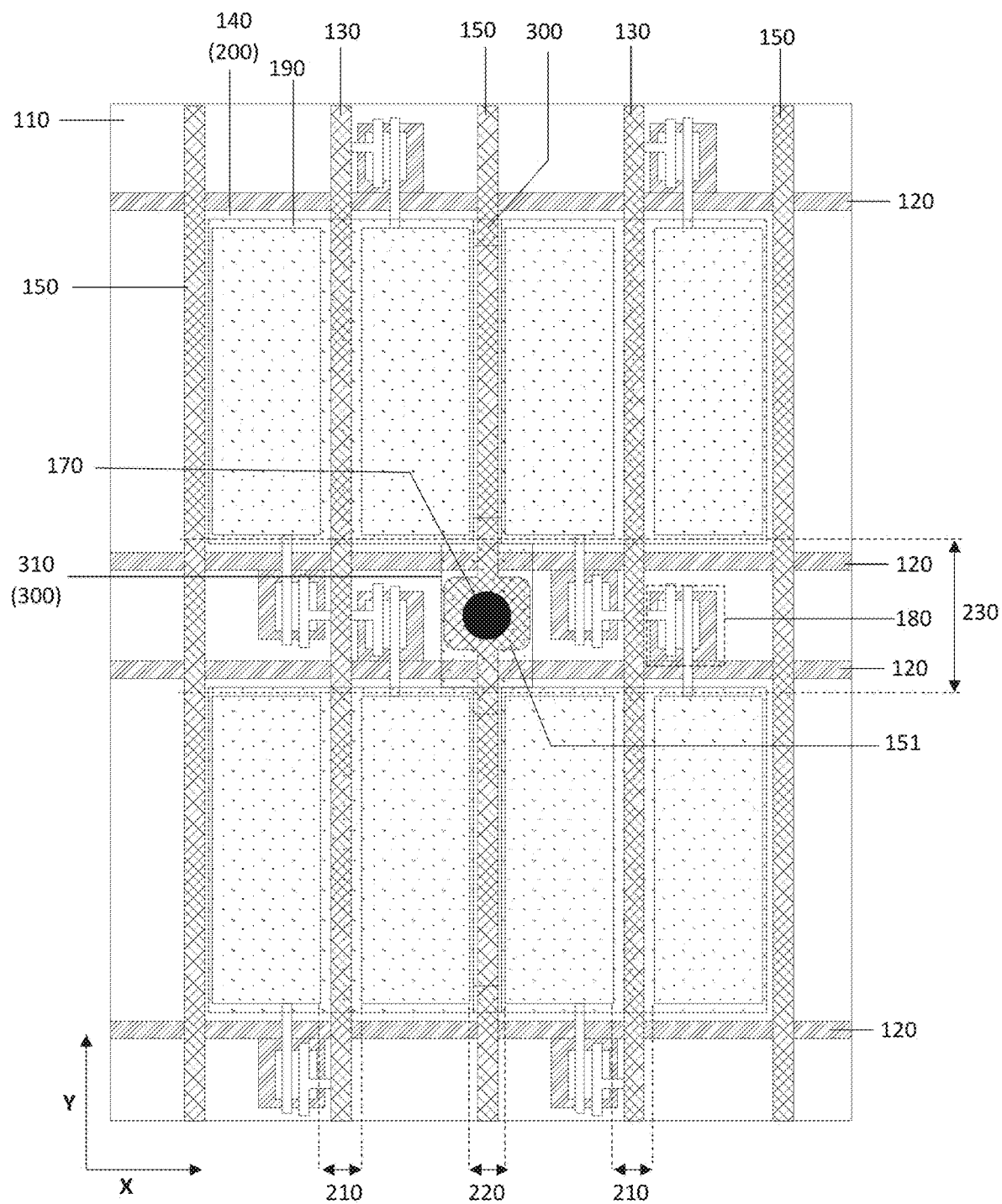
FIG. 10 is a layout diagram of still another array substrate according to an embodiment of the present disclosure.

As shown in FIG. 10, FIG. 10 is a layout diagram of still another array substrate according to an embodiment of the present disclosure.

In an embodiment, the common electrodes 200 are connected by the connecting portion 300 to form a common electrode set, and one common electrode set is reused as one touch electrode 140. The touch electrode 140 is connected to the touch trace 150 via a first through hole 170. The touch trace 150 includes the pad 151. The width of the touch trace 150 at the position of the pad 151 is larger than the width of the touch trace 150 at other positions. The width direction is parallel to the first direction X.

In an embodiment, the orthographic projection of the pad 151 on the base substrate 110 covers the first through hole 170.

In an embodiment, the orthographic projection of the pad 151 on the base substrate 110 is located between two scanning lines 120 in the third spacing 230 and does not overlap with the two scanning lines 120.

In an embodiment, the pad 151 has a same distance to the scanning lines 120 on both sides thereof.

In an embodiment, the pad 151 has a same distance to the thin film transistors 180 on both sides thereof.

In an embodiment, the pad 151 has a center symmetrical shape. The geometric center of the pad 151 is located on a line where the data line 130 is located.

With the array substrate provided in this embodiment, the pad is provided at the position corresponding to the first through hole of the touch trace. Since the width of the touch trace at the position of the pad is larger than the width of the touch trace at other positions, when the touch trace is patterned or the first through hole is manufactured on the first insulating layer, even if an error occurs for the position of the pattern and the position of the design in the process, and the through hole is not accurately aligned directly above the touch trace, the error can still be compensated by a pad with a larger width, so that the through hole may expose at least some of the touch traces under the first insulating layer, and thus the touch electrodes on the first insulating layer can be smoothly connected to the touch trace. Meanwhile, the first through hole is completely covered by the pad, so that when etching the first through hole, even if the first through hole is etched to be beyond the original aperture range, it can be blocked by the pad, so as to avoid exposure of the film layer under the film layer where the touch trace is located and thus prevent a film layer under the touch trace from being over-etched. That is, if the first through hole is etched to be beyond a reasonable aperture range, the first through hole may not only expose some of the touch traces but also expose a portion of the second insulating layer. The first insulating layer and the second insulating layer are both made of inorganic materials, an etchant that etches the first through hole of the first insulating layer also etches the second insulating layer. However, due to the blocking of the pad, even if the first through hole is extremely large, the second insulating layer can still be prevented from being exposed.

In an embodiment, the aperture of the first through hole 170 is larger than the width of the touch trace 150 at positions other than the position of the pad. This can improve the contact performance between the touch electrode and the touch trace, thereby reducing the resistance and reducing the voltage drop.

Further, in this embodiment, a gap is formed between adjacent common electrodes 200, and the gap between adjacent common electrodes 200 is located in the second spacing 220 and the third spacing 230. The common electrodes 200 are connected by the connecting portion 300 to form a common electrode set, and one common electrode set is one touch electrode 140. Connecting portions 300 is located in the second spacing 220 and the third spacing 230. The connecting portion 300 is located in the gap of the common electrodes 200 in a same common electrode set, so as to electrically connect the respective common electrodes 200, such that the common electrodes 200 can have a same potential so as to form one touch electrode 140.

In an embodiment, the connecting portions 300 include first connecting portions 310. The first connecting portion 310 extends in the second direction Y for connecting two adjacent common electrodes 200 in the second direction Y. The first connecting portion 310 is located in an overlapping area between the second spacing 220 and the third spacing 230. That is, in the first direction X, a thin film transistor 180 is provided on each of both sides of the touch trace 150 in the overlapping area between the second spacing 220 and the third spacing 230, and the first connecting portion 310 is located between the two thin film transistors 180.

In an embodiment, an orthographic projection of at least some of the first connecting portions 310 on the base substrate 110 covers the first through hole 170.

Further, an orthographic projection of at least some of the first connecting portions 310 on the base substrate 110 covers the pad 151.

In an embodiment, the first through hole 170 and the pad 151 have a same shape.

In an embodiment, the first through hole 170 has a same distance to the scanning lines 120 on both sides thereof. In this way, the coupling capacitance between the pad and the surrounding metal line can be balanced.

In an embodiment, the first through hole 170 has a same distance to the thin film transistors 180 on both sides thereof.

In an embodiment, the first through hole 170 has a center symmetrical shape, and the geometric center of the first through hole 170 is located on the line where the data line 130 is located.

Figure 11:
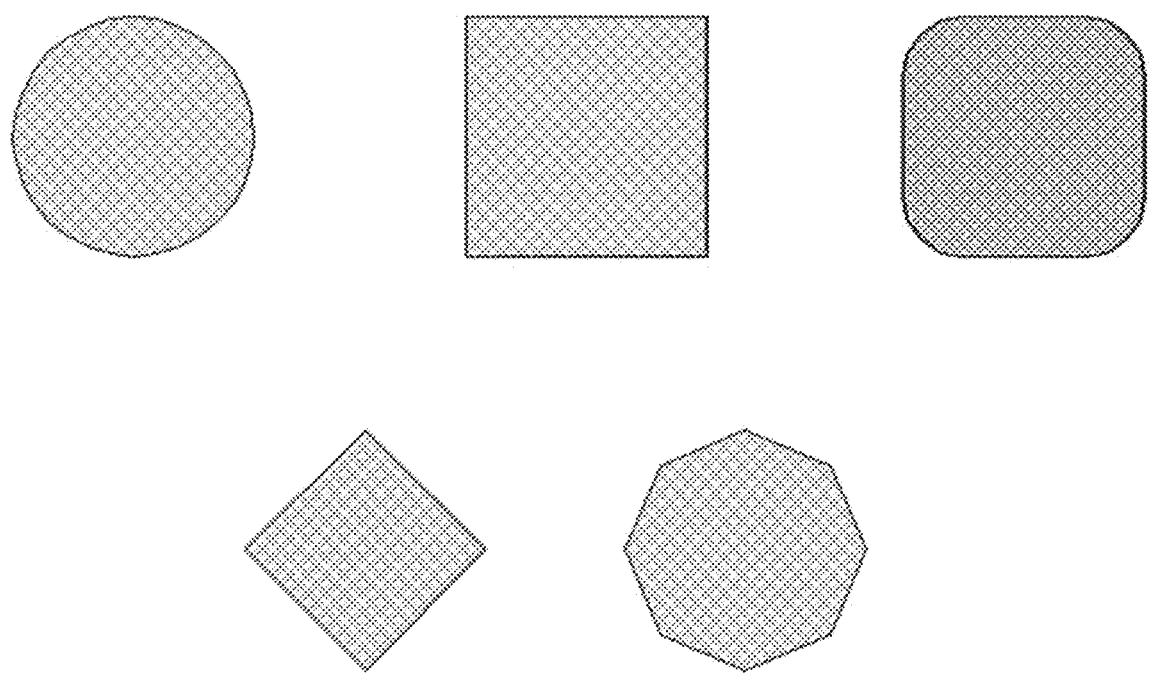
FIG. 11 is a schematic diagram showing a shape of a pad or a through hole of another array substrate according to an embodiment of the present disclosure.

The first through hole is filled with the common electrode material, and the first through hole is connected to the first connecting portion and the touch signal line. Therefore, a strong electric field exists in the area where the first through hole is located. In this embodiment, an aperture of the first through hole can be enlarged correspondingly, and the contact area between the first connecting portion at the first through hole and the touch signal can be increased, the contact performance between the first connecting portion at the first through hole and the touch signal can be improved, and the binding capability between the first connecting portion at the first through hole and the touch signal can be improved, so as to avoid signal disconnection due to layer separation. In addition, in this embodiment, the first through hole has a same distance to the scanning lines on both sides thereof, and the first through hole has a same distance to the thin film transistors on both sides thereof. Even if there is a strong electric field in the area where the first through hole is located, the first through hole with the enlarged range will get closer to the thin film transistor or the scanning line, so that the thin film transistor or the scanning line may be affected by the electric field of the first through hole area to generate parasitic capacitance or interference. However, the thin film transistors or the scanning lines on both sides of the first through hole can be consistently affected by the electric field, thereby reducing the parasitic capacitance difference generated by the thin film transistors or the scanning lines on both sides and thus weakening the display difference generated by the pixels under control of the thin film transistors or the scanning lines due to the interference or the parasitic capacitance. It should be understood that in other embodiments of the present disclosure, the shape of the first through hole or the pad can be other centrosymmetric pattern, and the shapes of the first through hole and the pad can be the same or can be designed differently according to other design requirements, such as the plurality of shapes shown in FIG. 11. FIG. 11 is a schematic diagram showing a shape of a pad or a through hole of another array substrate according to an embodiment of the present disclosure. The shapes of the plurality of first through holes or pads in the array substrate (i.e., the shape of the orthographic projection on the base substrate) can be, for example, a combination of one or more of a circle, a rectangle, a rounded rectangle, a diamond, and a regular polygon.

With the array substrate provided in this embodiment, the touch trace exposed by the first through hole is connected to the touch electrode by the connecting portion, so that the common electrode can be prevented from overlapping with the touch trace of the common electrode, thereby preventing the parasitic capacitance from affecting the touch precision. Moreover, disposing the first through hole in the non-pixel aperture area (i.e., in the third spacing) can facilitate increasing the aperture ratio of the display panel.

Figure 12:
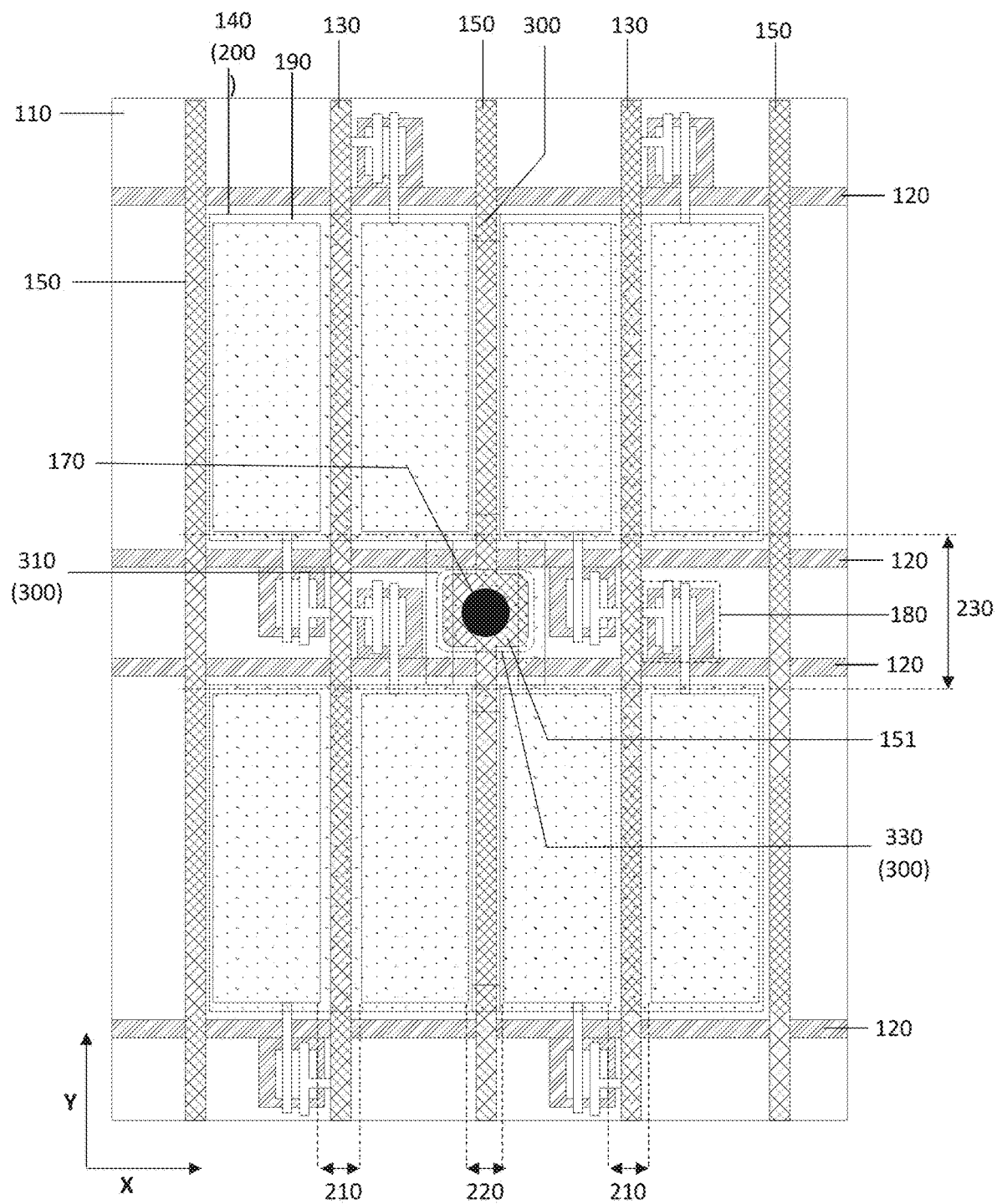
FIG. 12 is a layout diagram of still another array substrate according to an embodiment of the present disclosure.
Figure 13:
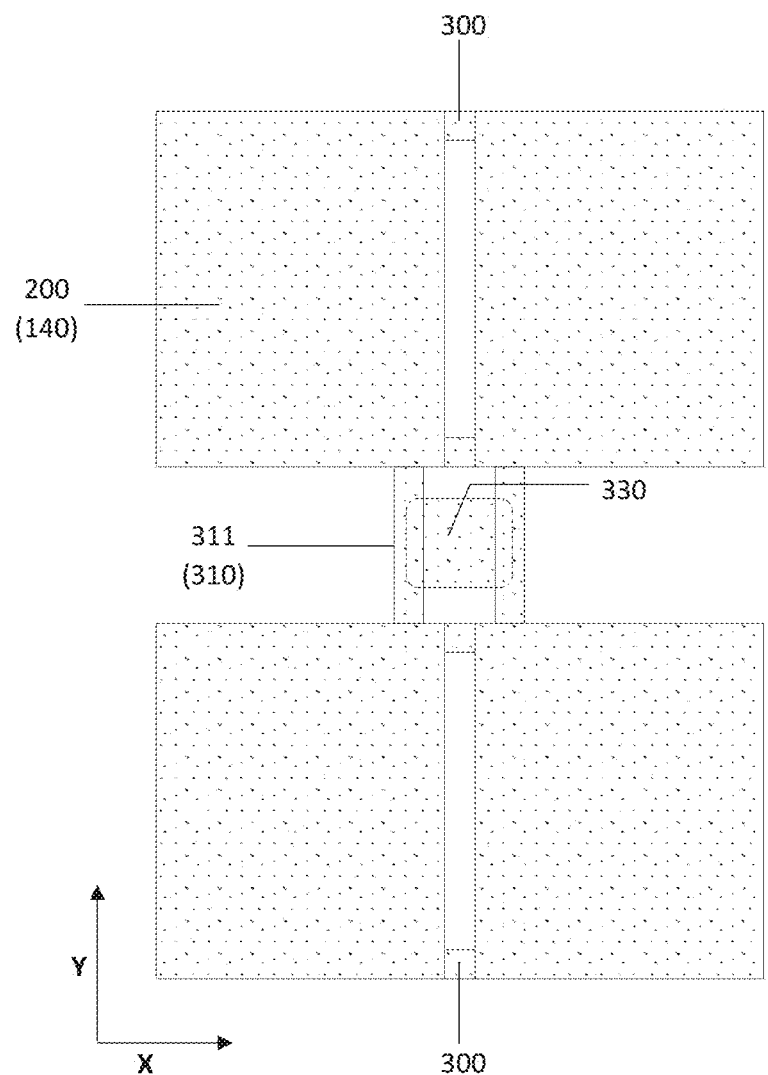
FIG. 13 is a partial schematic view of common electrodes in FIG. 12.

As shown in FIG. 12 and FIG. 13, FIG. 12 is a layout diagram of still another array substrate according to an embodiment of the present disclosure, and FIG. 13 is a partial schematic view of common electrodes in FIG. 12.

In an embodiment, the connecting portions 300 include first connecting portions 310. The first connecting portion 310 extends in the second direction Y and is used for connecting two adjacent common electrodes 200 in the second direction Y. The first connecting portion 310 is located in an overlapping area between the second spacing 220 and the third spacing 230. That is, in the first direction X, there is one thin film transistor 180 provided on each of both sides of the touch trace 150 in the overlapping area between the second spacing 220 and the third spacing 230, and the first connecting portion 310 is located between the two thin film transistors 180.

In an embodiment, at least some of the first connecting portions 310 include at least two first branches 311 extending in the second direction Y. A first branch 311 is provided on each of both sides of the touch trace 150. At least some of the adjacent common electrodes 200 in the second direction Y are electrically connected by the first branches 311. That is, in the first direction X, there is one thin film transistor 180 provided on each of both sides of the touch trace 150 in the overlapping area between the second spacing 220 and the third spacing 230. Although the first connecting portion 310 is located on each of both sides of the touch trace 150, it is still located between the two thin film transistors 180.

In an embodiment, at least some of the first connecting portions 310 located in the overlapping area of spacing where the first through hole 170 is located can further include an auxiliary portion 330. The first branches 311 can be connected by the auxiliary portion 330, and the orthographic projection of the auxiliary portion 330 on the base substrate 110 covers the first through hole 170.

In an embodiment, the orthographic projection of the auxiliary portion 330 on the base substrate 110 does not overlap with the scanning line 120.

In an embodiment, the auxiliary portion 330 has a same distance to the scanning lines 120 on both sides thereof.

In an embodiment, the auxiliary portion 330 has a same distance to the thin film transistors 180 on both sides thereof.

In an embodiment, the auxiliary portion 330 has a center symmetrical shape, and the geometric center of the pad 151 is located on the line where the data line 130 is located.

In an embodiment, the orthographic projection of the auxiliary portion 330 on the base substrate 110 covers the pad 151.

In an embodiment, the width of the auxiliary portion 330 is larger than the width of the first branch 311. The width direction is parallel to the first direction X.

In an embodiment, the auxiliary portion 330 and the pad 151 have a same shape.

With the array substrate provided in this embodiment, the aperture of the first through hole can be correspondingly enlarged by the auxiliary portion of the connecting portion, and the contact area between the first connecting portion at the first through hole and the touch signal can be increased, the contact performance between the first connecting portion at the first through hole and the touch signal can be improved, and the binding capability between the first connecting portion at the first through hole and the touch signal can be improved, so as to avoid signal disconnection due to layer separation. Meanwhile, the auxiliary portion is connected to the first branch and then connected to the common electrode through the first branch, so that an auxiliary portion with an larger width can be used to enhance the contact performance between the first connecting portion at the first through hole and the touch signal without overlapping with the scanning line, thereby avoiding a large overlapping area between the scanning line and the connecting portion, which would otherwise result in a large parasitic capacitance. In addition, the signal between each common electrode is transmitted through the connecting portion, and the signal may lead to a voltage drop when flowing through the common electrode. At least two first branches are connected by the auxiliary portion, and the two first branches are located on both sides of the data line in the first direction. In this way, all the common electrodes in each direction of the first through hole (i.e., four common electrodes located at upper left, lower left, upper right and lower right of the first through hole as shown in FIG. 12) can be connected to the auxiliary portion through the first branch, so that the signal has a same voltage drop degree when getting to the common electrode in each direction of the first through hole, thereby making the overall touch precision of the display panel more uniform.

Figure 14:
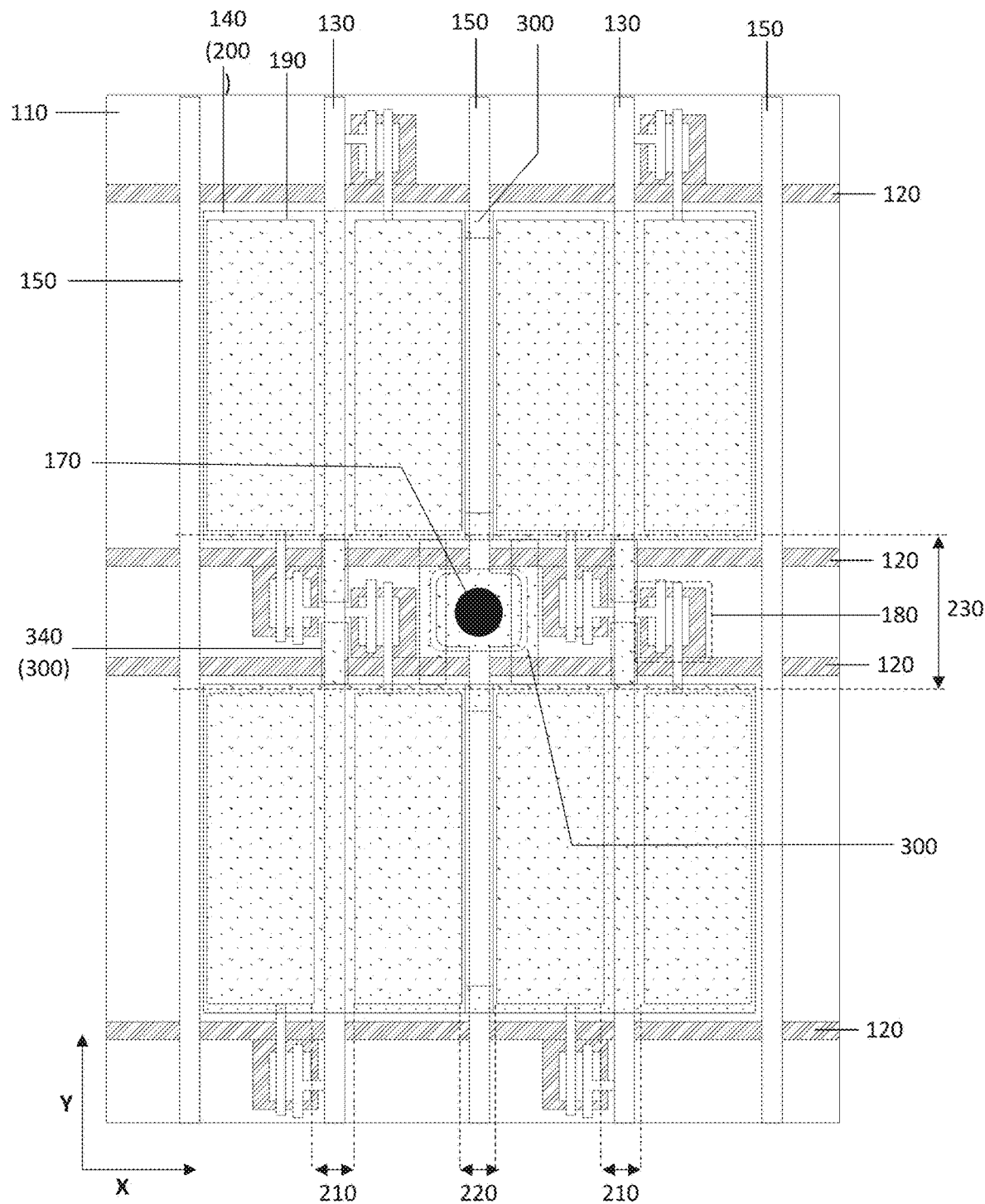
FIG. 14 is a layout diagram of still another array substrate according to an embodiment of the present disclosure.
Figure 15:
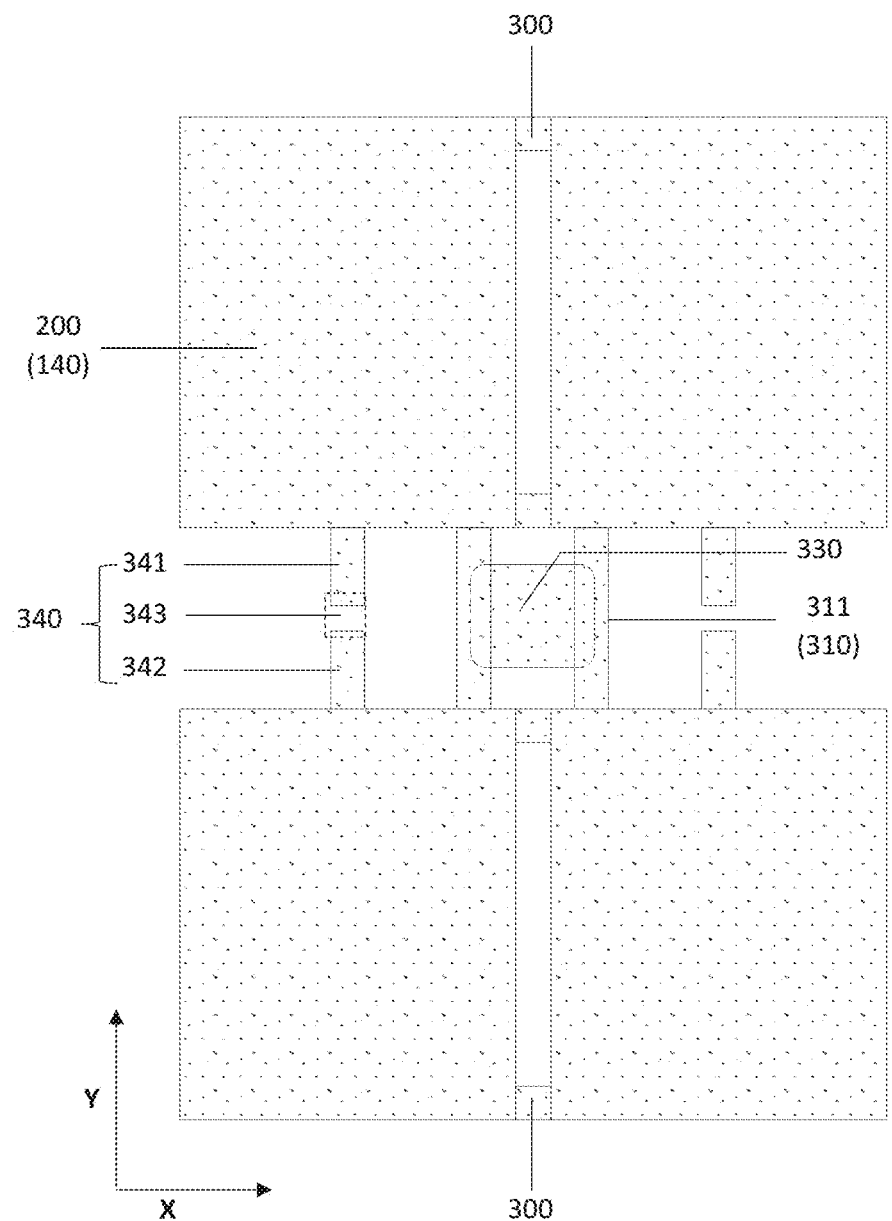
FIG. 15 is a partial schematic view of common electrodes in FIG. 14.

As shown in FIG. 14 and FIG. 15, FIG. 14 is a layout diagram of still another array substrate according to an embodiment of the present disclosure, and FIG. 15 is a partial schematic view of common electrodes in FIG. 14.

The connecting portions 300 can further include dummy connecting portions 340.

At least some of the dummy connecting portions 340 are located in an overlapping area between the first spacing 210 and the third spacing 230, and the orthographic projection of the dummy connecting portion 340 on the substrate 110 overlaps with the data line 130.

The dummy connecting portion 340 includes a break 343 that divides the dummy connecting portion 340 into a first dummy section 341 and a second dummy section 342 that are spaced apart from each other in the second direction Y.

In the second direction Y, each of the first dummy section 341 and the second dummy section 342 is electrically connected to a common electrode 200 adjacent thereto.

In an embodiment, the width of the dummy connecting portion 340 is larger than the width of the data line 130. The width direction is parallel to the first direction X.

In an embodiment, the break 343 is located in an area where the data line 130 is connected to the source electrode or the drain electrode of the thin film transistor 180.

In an embodiment, the first dummy section 341 and the second dummy section 342 are symmetric with respect to the break 343. Thus, even if the data line 130 has a portion exposed by the break 343 of the dummy connecting portion 340, the difference in the degree at which the exposed portion of the data line 130 affects both sides thereof can be decreased, and the display effect of the display panel can be further improved.

With the array substrate provided in this embodiment, on the one hand, the dummy connecting portion 340 can prevent the electric field leakage of the data line from affecting the liquid crystals in the display panel, and it can also prevent the dummy connecting portion 340 from affecting the performance of the thin film transistor 180 (especially the active layer of the thin film transistor 180).

On the other hand, when two adjacent common electrodes in the second direction belong to different common electrode sets and are used as two touch electrodes, the two common electrodes cannot be directly connected by the first connecting portion. However, in this embodiment, a dummy connection can be achieved by the dummy connecting portion, so that the common electrodes belonging to different common electrode sets may not be connected together, which would otherwise result in touch abnormality. Moreover, the exposed data line at the gap between the two common electrode sets can be blocked as much as possible, thereby preventing the electric field leakage of the data line at this position from affecting the liquid crystals in the display panel, and thus improving the uniformity of the connection portion shielding the electric field leakage of the data line in each part of the display panel, which can facilitate the display uniformity of the display panel.

Figure 16:
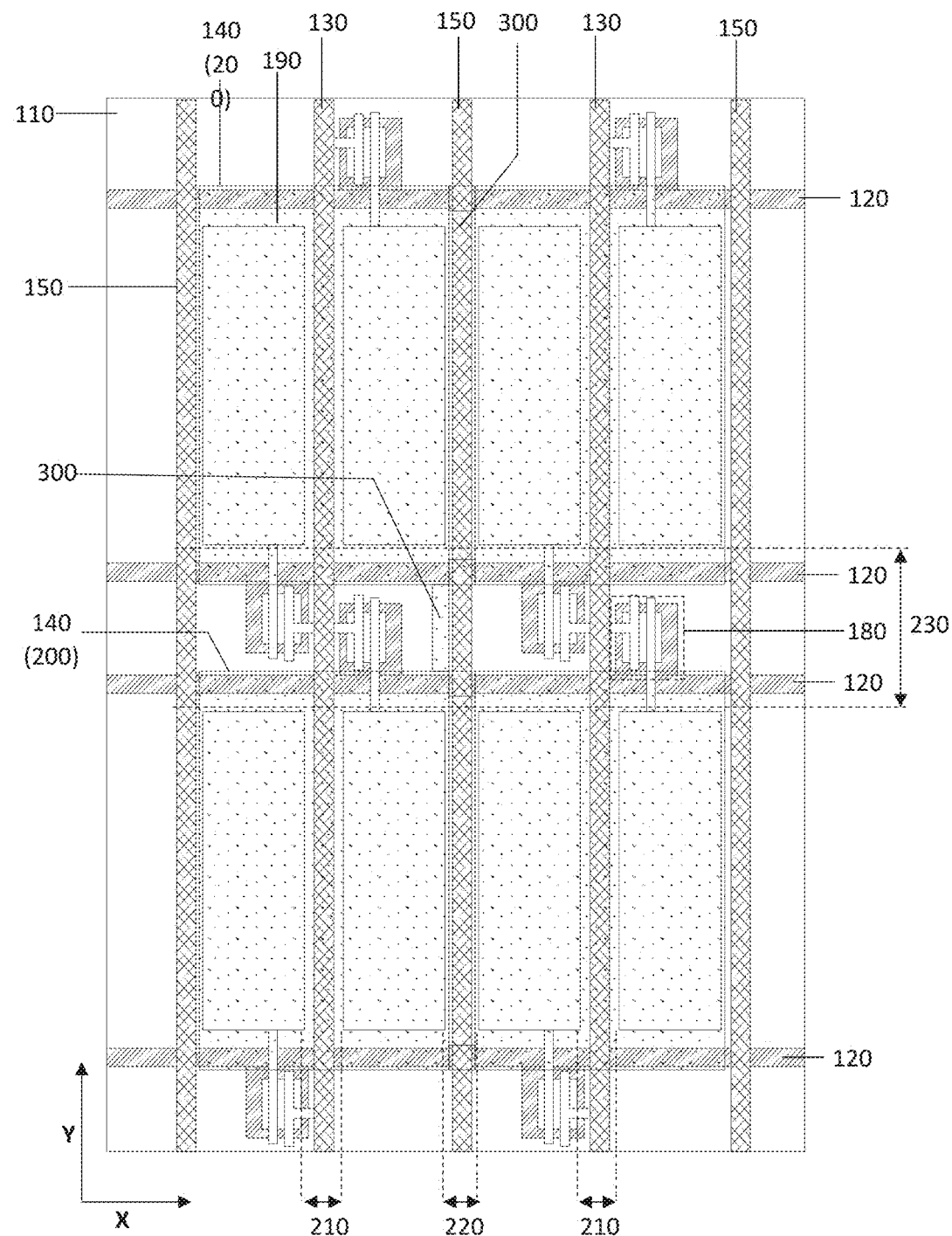
FIG. 16 is a layout diagram of still another array substrate according to an embodiment of the present disclosure.

As shown in FIG. 16, FIG. 16 is a layout diagram of still another array substrate according to an embodiment of the present disclosure.

In an embodiment, each of two scanning lines 120 in one third spacing 230 is covered by a common electrode 200 adjacent thereto.

In an embodiment, in one third spacing 230, the thin film transistor 180 is located between two scanning lines 120. The common electrode 200 does not cover the thin film transistor 180.

In this way, the scanning line 120 is covered by the common electrode 200, so that the electric field generated by the scanning line 120 can be prevented from affecting the liquid crystals in the display panel, and thus the display effect of the display panel can be improved. Meanwhile, since the thin film transistor 180 is located between two scanning lines 120, the scanning line 120 can be closer to the common electrode 200 without considering the avoidance of the thin film transistor 180, and the aperture ratio of the thin film transistor 180 occupying the display panel can also be decreased. Moreover, the common electrode 200 can be set to cover the scanning line 120 without covering the thin film transistor 180, thereby preventing the signal of the common electrode 200 from affecting the performance of the thin film transistor 180 (especially the active layer of the thin film transistor 180). Therefore, this can shield the signal leakage of the scanning line 120 while decreasing the affection on the thin film transistor 180 by the common electrode 200.

Figure 17:
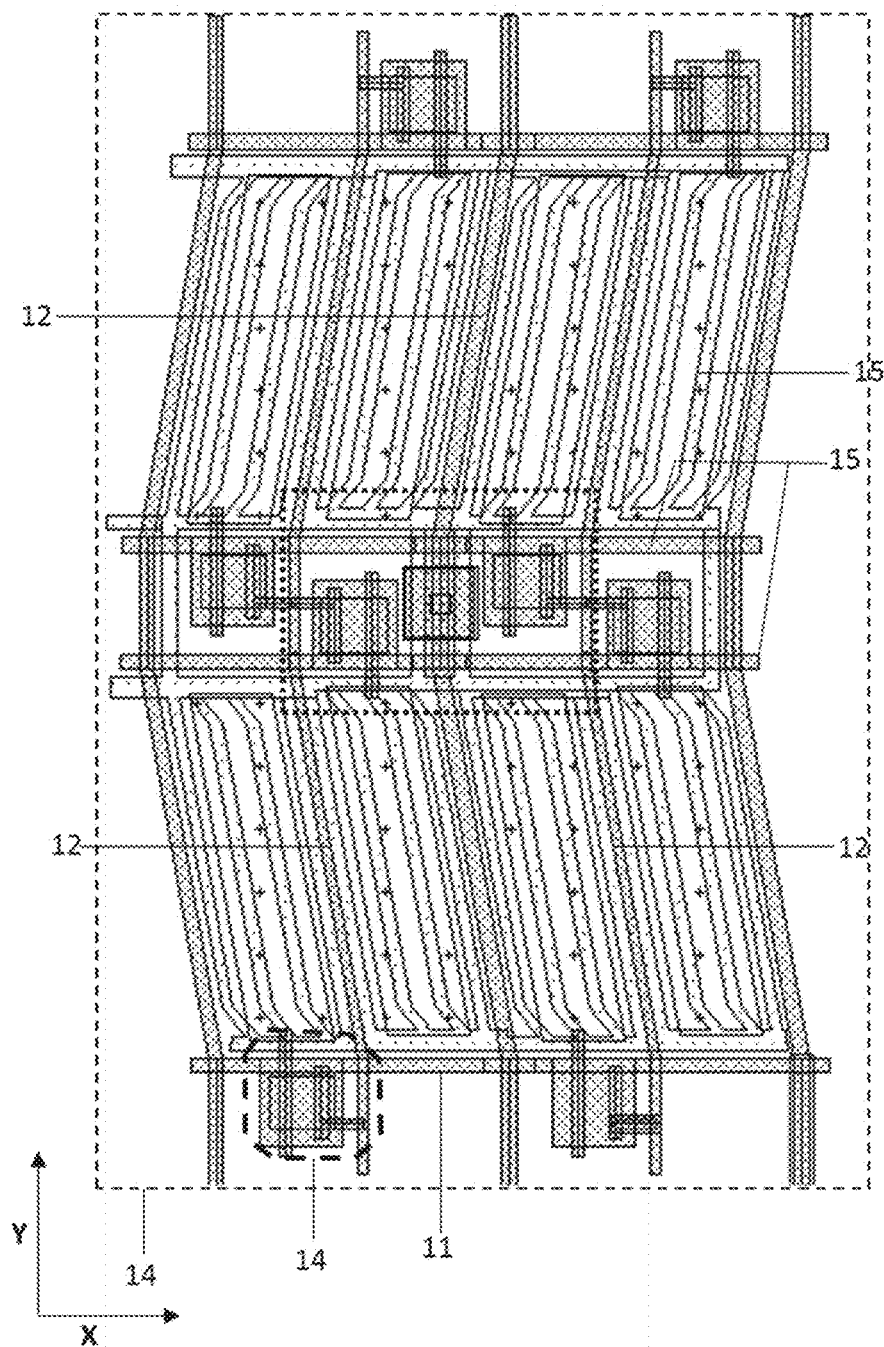
FIG. 17 is a layout diagram of still another array substrate according to an embodiment of the present disclosure.
Figure 18:
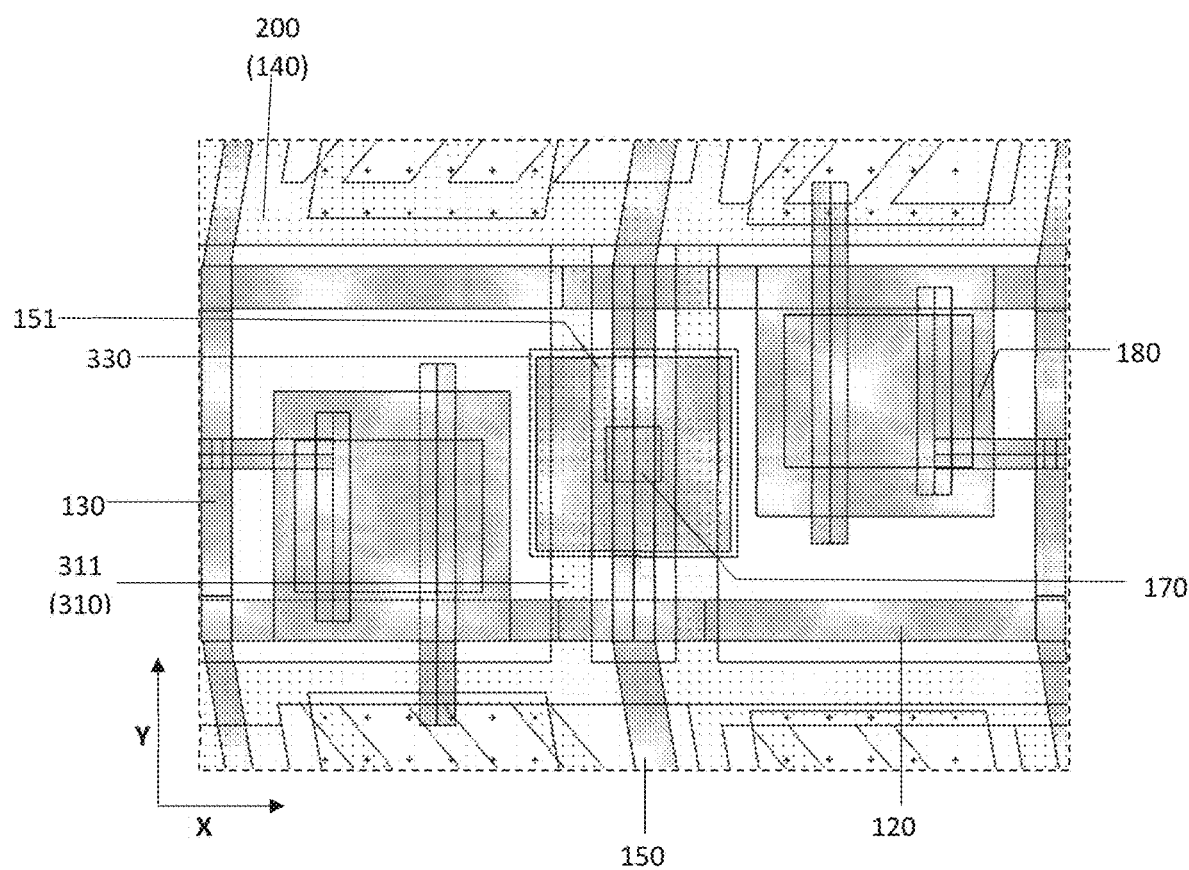
FIG. 18 is a partial enlarged schematic view of the dashed box in FIG. 17.

As shown in FIG. 17 and FIG. 18, FIG. 17 is a layout diagram of still another array according to an embodiment of the present disclosure, and FIG. 18 is a partial enlarged schematic view of the dashed box in FIG. 17.

In an embodiment, the common electrode 200 includes strip-shaped sub-portions including a first sub-portion extending in a third direction and a second sub-portion extending in a fourth direction. In an embodiment, the first direction is the same as the third direction, and the second direction is the same as the fourth direction. The first sub-portions are arranged in the fourth direction, and there is a gap between adjacent first sub-portions. An electric field is formed between the pixel electrode located underneath the common electrode and the first sub-portion of the common electrode, and the electric field can pass through the gap between the first sub-portions so as to control the rotation of the liquid crystals above the display substrate. The first sub-portions are connected by the second sub-portion.

Further, in other embodiments of the present disclosure, the second sub-portions of some of the common electrodes may extend to form a connecting portion.

In other embodiments of the present disclosure, the orthographic projection of the auxiliary portion on the base substrate covers the pad. The distance between the edge of the auxiliary portion and the edge of the pad is in a range of 0-1 µm, including endpoint values. The shape of the through hole is an inverted cone or an inverted pyramid, that is, the aperture of the through hole generally decreases from top to bottom (i.e., a direction toward the bottom), so that the auxiliary portion located on the through hole is larger than the pad, and thus the pad can still be connected to the auxiliary portion when an etching error occurs. Further, the auxiliary portion can have a same shape as the pad.

In other embodiments of the present disclosure, the touch trace and the data line are alternately arranged and are disposed in a ratio of 1:1. In an embodiment, the second spacing can also include a dummy touch trace, and the dummy touch trace is not connected to the touch electrode. As an example, the dummy touch trace can be connected to a fixed point. Since the number of touch electrodes is smaller than half of the number of pixel columns, if the number of touch electrodes and the number of touch traces are in a ratio of 1:1, the touch traces cannot correspond to the second spacing in one-to-one correspondence. With the dummy touch trace, a trace can be provided in each spacing between pixels extending along the second direction, so as to achieve the uniformity of the layout of the array substrate.

Figure 19:
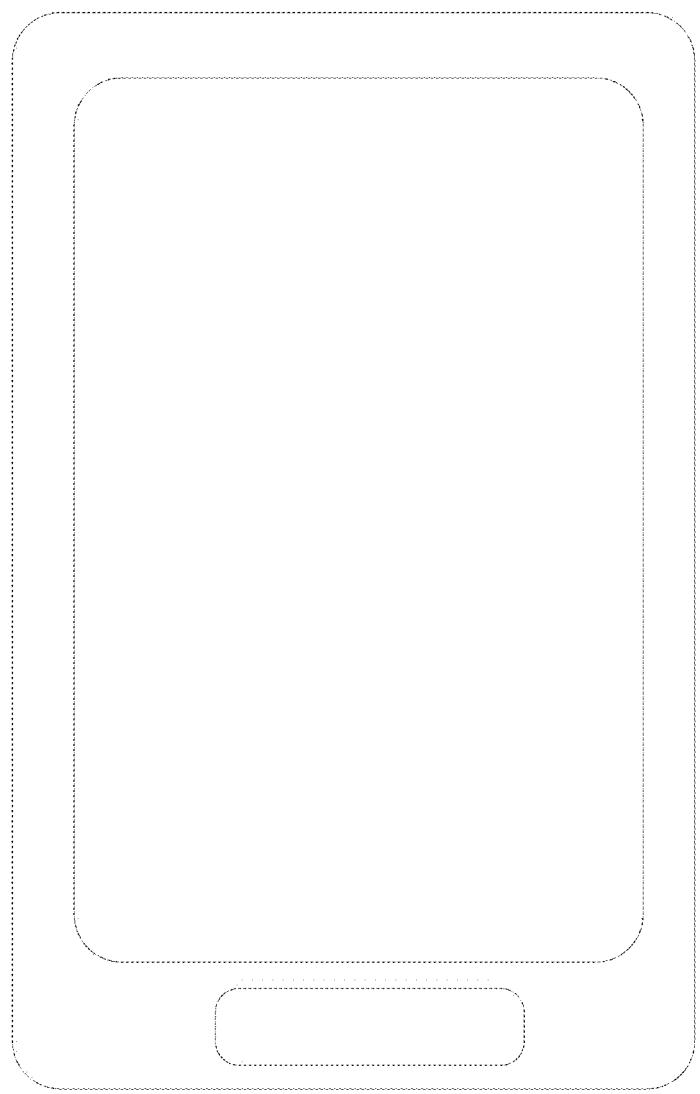
FIG. 19 is a schematic diagram of a display device according to an embodiment of the present disclosure.

The present disclosure further provides a display device. As shown in FIG. 19, which is a schematic diagram of a display device according to an embodiment of the present disclosure, the display device includes the array substrate or the display panel provided by any one of the above embodiments. The display device can be a cellphone, a tablet computer, a wearable device, or the like. It should be understood that the display device can further include a driving chip, a glass cover or the like structure, and details thereof will not be described herein. In an embodiment, the display device can further include a touch tool used in conjunction with the display panel provided by the above embodiments. The touch tool can be a touch pen, a card, or the like shaped like a writing tool.

What is claimed is:
1. An array substrate, comprising:
a base substrate;

a plurality of scanning lines disposed on the base substrate and extending along a first direction;

a plurality of data lines disposed on the base substrate and extending along a second direction, wherein the plurality of scanning lines intersects with and is insulated from the plurality of data lines;

a plurality of pixel units arranged in an array along the first direction and the second direction;

a plurality of touch electrodes and a plurality of touch traces, both of which are disposed on the base substrate; and a first insulating layer disposed between the plurality of touch traces and the plurality of touch electrodes in a direction perpendicular to the base substrate, wherein each of the plurality of touch traces is connected to a corresponding one of the plurality of touch electrodes via a first through hole in the first insulating layer, wherein two scanning lines of the plurality of scanning lines are disposed between two adjacent pixel units of at least some of the plurality of pixel units in the second direction, and each of the two scanning lines controls its adjacent pixel unit of the two adjacent pixel units; and wherein an orthographic projection of the first through hole on the base substrate is located between the two scanning lines and does not overlap with the two scanning lines, wherein the array substrate further comprises a plurality of common electrodes disposed on the base substrate, one of the plurality of common electrodes is reused as a respective one of the plurality of touch electrodes, and at least one of the plurality of touch traces transmits a touch voltage to a corresponding one of the plurality of common electrodes during a touch period and transmits a common voltage to the corresponding one of the plurality of common electrodes during a display period, wherein some of the plurality of common electrodes are connected to each other by one of a plurality of connecting portions to form a common electrode set, and the common electrode set is reused as one of the plurality of touch electrodes, wherein the plurality of connecting portions comprises a plurality of first connecting portions, and two adjacent common electrodes of at least some of the plurality of common electrodes in the second direction are electrically connected by respective one or more of the plurality of first connecting portions, and wherein each of at least some of the plurality of first connecting portions comprises at least two first branches extending along the second direction, and the at least two first branches are located on both sides of a respective one of the plurality of touch traces; and wherein two adjacent common electrodes of at least some of the plurality of common electrodes in the second direction are electrically connected by respective one or more of the at least two first branches.

2. The array substrate according to claim 1, wherein a first spacing and a second spacing extending along the second direction are formed between at least some of the plurality of pixel units; along the first direction, the first spacing and the second spacing are alternately arranged; and one of the plurality of data lines is arranged in the first spacing, and none of the plurality of data lines is arranged in the second spacing; and wherein a third spacing extending along the first direction is formed between at least some of the plurality of pixel units; and along the second direction, two of the plurality of scanning lines are arranged in the third spacing.

3. The array substrate according to claim 1, wherein the plurality of common electrodes and the plurality of connecting portions are disposed in a same layer and made of a same material, and the material is a transparent conductive material.

4. The array substrate according to claim 1, wherein an orthographic projection of the first through hole on the base substrate has a centrosymmetric shape.

5. The array substrate according to claim 2, wherein at least one of two scanning lines of the plurality of scanning lines located within a same spacing is covered by a common electrode of one the plurality of pixel units adjacent thereto.

6. The array substrate according to claim 2, further comprising:

a plurality of thin film transistors disposed in the third spacing;

wherein at least one of the plurality of thin film transistors comprises: a gate electrode disposed on the base substrate; a gate insulating layer disposed on a side of the gate electrode away from the base substrate; an active layer disposed on a side of the gate insulating layer away from the base substrate; a source electrode and a drain electrode disposed on a side of the active layer away from the base substrate, the source electrode and the drain electrode being spaced apart from each other and both being in contact with the active layer; and a second insulating layer disposed on a side of the source electrode and the drain electrode away from the base substrate; and wherein in the third spacing, one data line of the plurality of data lines is connected to the source electrodes or the drain electrodes of two thin film transistors of the plurality of thin film transistors adjacent to the one data line; and the gate electrodes of the two thin film transistors connected to the one data line are connected to different scanning lines of the plurality of scan lines.

7. The array substrate according to claim 2, wherein each of the plurality of touch traces extends in the second direction and is located in the second spacing.

8. The array substrate according to claim 7, wherein the plurality of scanning lines is disposed in a different layer from the plurality of data lines, the plurality of data lines and the plurality of touch traces are disposed in a same layer and made of a same material; and wherein the plurality of touch electrodes is located on a side of the plurality of scanning lines and the plurality of data lines away from the base substrate.

9. The array substrate according to claim 7, wherein a gap is formed between two adjacent common electrodes of some of the plurality of common electrodes, and the gap is located in the second spacing and/or the third spacing.

10. The array substrate according to claim 7, wherein the plurality of connecting portions comprises a plurality of second connecting portions;

wherein each of the plurality of second connecting portions is located in an overlapping area between the first spacing and the third spacing;

wherein two adjacent common electrodes of at least some of the plurality of common electrodes in the second direction are electrically connected by respective one or more of the second connecting portion; and wherein an orthographic projection of one of the plurality of second connecting portions on the base substrate overlaps with a respective one of the plurality of data lines.

11. The array substrate according to claim 7, wherein the plurality of connecting portions further comprises a plurality of dummy connecting portions;
wherein each of at least some of the plurality of dummy connecting portions is located in an overlapping area between the first spacing and the third spacing, and an orthographic projection of one of the plurality of dummy connecting portions on the base substrate overlaps with respective one or more of the plurality of data lines; and
wherein at least one of the plurality of dummy connecting portions further comprises a break, wherein the break divides the dummy connecting portion into a first dummy section and a second dummy section spaced apart from each other in the second direction; and in the second direction, the first dummy section is electrically connected to one of the plurality of common electrodes adjacent thereto, and the second dummy section is electrically connected to one of the plurality of common electrodes adjacent thereto.

12. The array substrate according to claim 7, wherein at least one of the plurality of touch traces comprises a pad and has a width at the pad larger than its width at other positions; and
wherein an orthographic projection of the pad on the base substrate is located between the two scanning lines in the third spacing and does not overlap with the two scanning lines.

13. The array substrate according to claim 12, wherein the orthographic projection of the pad on the base substrate or the orthographic projection of the first through hole on the base substrate has a same distance from two scanning lines of the plurality of scanning lines located on both sides thereof.

14. The array substrate according to claim 12, wherein the orthographic projection of the pad on the base substrate covers the first through hole.

15. The array substrate according to claim 12, wherein an orthographic projection of each of at least some of the plurality of first connecting portions on the base substrate covers the first through hole or an orthographic projection of each of at least some of the plurality of first connecting portions on the base substrate covers the pad.

16. The array substrate according to claim 12, wherein an orthographic projection of the pad on the base substrate has a centrosymmetric shape.

17. The array substrate according to claim 7, wherein
at least one of the plurality of first connecting portions is located in an overlapping area between the second spacing and the third spacing.

18. The array substrate according to claim 17, wherein each of at least some of the plurality of first connecting portions located in the overlapping area where the first through hole is located further comprises an auxiliary portion, the auxiliary portion connects the at least two first branches, and an orthographic projection of the auxiliary portion on the base substrate covers the first through hole.

19. A display panel, comprising:
an array substrate, comprising:
a base substrate;
a plurality of scanning lines disposed on the base substrate and extending along a first direction;
a plurality of data lines disposed on the base substrate and extending along a second direction, wherein the plurality of scanning lines intersects with and is insulated from the plurality of data lines;
a plurality of pixel units arranged in an array along the first direction and the second direction;
a plurality of touch electrodes and a plurality of touch traces, both of which are disposed on the base substrate; and
a first insulating layer disposed between the plurality of touch traces and the plurality of touch electrodes in a direction perpendicular to the base substrate, wherein each of the plurality of touch traces is connected to a corresponding one of the plurality of touch electrodes via a first through hole in the first insulating layer,
wherein two scanning lines of the plurality of scanning lines are disposed between two adjacent pixel units of at least some of the plurality of pixel units in the second direction, and each of the two scanning lines controls its adjacent pixel unit of the two adjacent pixel units; and wherein an orthographic projection of the first through hole on the base substrate is located between the two scanning lines and does not overlap with the two scanning lines;
wherein the array substrate further comprises a plurality of common electrodes disposed on the base substrate, one of the plurality of common electrodes is reused as a respective one of the plurality of touch electrodes, and at least one of the plurality of touch traces transmits a touch voltage to a corresponding one of the plurality of common electrodes during a touch period and transmits a common voltage to the corresponding one of the plurality of common electrodes during a display period,
wherein some of the plurality of common electrodes are connected to each other by one of a plurality of connecting portions to form a common electrode set, and the common electrode set is reused as one of the plurality of touch electrodes,
wherein the plurality of connecting portions comprises a plurality of first connecting portions, and two adjacent common electrodes of at least some of the plurality of common electrodes in the second direction are electrically connected by respective one or more of the plurality of first connecting portions, and
wherein each of at least some of the plurality of first connecting portions comprises at least two first branches extending along the second direction, and the at least two first branches are located on both sides of a respective one of the plurality of touch traces; and wherein two adjacent common electrodes of at least some of the plurality of common electrodes in the second direction are electrically connected by respective one or more of the at least two first branches;
a color film substrate disposed to be opposite to the array substrate; and
a liquid crystal layer sealed between the array substrate and the color film substrate.

20. A display device, comprising:
a display panel, comprising:
an array substrate, comprising:
a base substrate;
a plurality of scanning lines disposed on the base substrate and extending along a first direction;
a plurality of data lines disposed on the base substrate and extending along a second direction, wherein the plurality of scanning lines intersects with and is insulated from the plurality of data lines;

a plurality of pixel units arranged in an array along the first direction and the second direction;

a plurality of touch electrodes and a plurality of touch traces, both of which are disposed on the base substrate; and a first insulating layer disposed between the plurality of touch traces and the plurality of touch electrodes in a direction perpendicular to the base substrate, wherein each of the plurality of touch traces is connected to a corresponding one of the plurality of touch electrodes via a first through hole in the first insulating layer, wherein two scanning lines of the plurality of scanning lines are disposed between two adjacent pixel units of at least some of the plurality of pixel units in the second direction, and each of the two scanning lines controls its adjacent pixel unit of the two adjacent pixel units; and wherein an orthographic projection of the first through hole on the base substrate is located between the two scanning lines and does not overlap with the two scanning lines;

wherein the array substrate further comprises a plurality of common electrodes disposed on the base substrate, one of the plurality of common electrodes is reused as a respective one of the plurality of touch electrodes, and at least one of the plurality of touch traces transmits a touch voltage to a corresponding one of the plurality of common electrodes during a touch period and transmits a common voltage to the corresponding one of the plurality of common electrodes during a display period, wherein some of the plurality of common electrodes are connected to each other by one of a plurality of connecting portions to form a common electrode set, and the common electrode set is reused as one of the plurality of touch electrodes, wherein the plurality of connecting portions comprises a plurality of first connecting portions, and two adjacent common electrodes of at least some of the plurality of common electrodes in the second direction are electrically connected by respective one or more of the plurality of first connecting portions, and wherein each of at least some of the plurality of first connecting portions comprises at least two first branches extending along the second direction, and the at least two first branches are located on both sides of a respective one of the plurality of touch traces; and wherein two adjacent common electrodes of at least some of the plurality of common electrodes in the second direction are electrically connected by respective one or more of the at least two first branches;

a color film substrate disposed to be opposite to the array substrate; and a liquid crystal layer sealed between the array substrate and the color film substrate.

\* \* \* \* \*